(12) United States Patent
Gutierrez et al.

(10) Patent No.: US 9,617,142 B1
(45) Date of Patent: Apr. 11, 2017

(54) MEMS GRID FOR MANIPULATING STRUCTURAL PARAMETERS OF MEMS DEVICES

(71) Applicant: MEMS DRIVE, INC., Arcadia, CA (US)

(72) Inventors: Roman Gutierrez, Arcadia, CA (US); Tony Tang, Arcadia, CA (US); Xiaolei Liu, South Pasadena, CA (US); Guiqin Wang, Arcadia, CA (US); Matthew Ng, Rosemead, CA (US)

(73) Assignee: MEMS Drive, Inc., Arcadia, CA (US)

( * ) Notice: Subject to any disclaimer, the term of this patent is extended or adjusted under 35 U.S.C. 154(b) by 0 days.

(21) Appl. No.: 14/872,123

(22) Filed: Sep. 30, 2015

(51) Int. Cl.
*B81B 7/00* (2006.01)
*B81B 7/02* (2006.01)
*B81C 1/00* (2006.01)
*H01L 23/00* (2006.01)
*H01L 23/31* (2006.01)

(52) U.S. Cl.
CPC ........ *B81B 7/0029* (2013.01); *B81C 1/00674* (2013.01); *B81C 2201/0135* (2013.01); *H01L 2924/00* (2013.01); *H01L 2924/0002* (2013.01); *H01L 2924/00014* (2013.01); *H01L 2924/1461* (2013.01); *H01L 2924/181* (2013.01)

(58) Field of Classification Search
CPC ....... H01L 2924/00; H01L 2924/00014; H01L 2924/0002; H01L 2924/181; H01L 2924/1461
USPC .... 257/414, 415; 438/43, 50, 106, FOR. 119
See application file for complete search history.

(56) References Cited

U.S. PATENT DOCUMENTS

| | | | |
|---|---|---|---|
| 6,521,477 B1* | 2/2003 | Gooch | B81B 7/0077 438/106 |
| 7,616,077 B1* | 11/2009 | Wittwer | H03H 3/0072 333/186 |
| 7,785,098 B1* | 8/2010 | Appleby | B29C 33/302 264/319 |
| 7,965,491 B2* | 6/2011 | Abe | H01G 5/16 361/281 |
| 2004/0048410 A1 | 3/2004 | O'Brien et al. | |
| 2004/0151626 A1* | 8/2004 | Cunningham | B01L 3/5085 435/287.2 |
| 2007/0194406 A1 | 8/2007 | Patel | |
| 2008/0079142 A1 | 4/2008 | Carmona et al. | |
| 2009/0025477 A1 | 1/2009 | Pilchowski et al. | |
| 2010/0002894 A1* | 1/2010 | Lan | H04R 31/00 381/163 |

(Continued)

OTHER PUBLICATIONS

Sarajlic et al., Advanced plasma processing combined with trench isolation technology for fabrication and fast prototyping of high aspect ratio MEMS in standard silicon wafers, Journal of Micromechanics and Microengineering, Aug. 20, 2004, pp. 70-75, (14), IOP Publishing Ltd, UK.

(Continued)

*Primary Examiner* — Ly D Pham
(74) *Attorney, Agent, or Firm* — Brian J. Colandreo; Michael T. Abramson; Holland & Knight LLP

(57) ABSTRACT

A system and method for manipulating the structural characteristics of a MEMS device include etching a plurality of holes into the surface of a MEMS device, wherein the plurality of holes comprise one or more geometric shapes determined to provide specific structural characteristics desired in the MEMS device.

6 Claims, 24 Drawing Sheets

(56) References Cited

U.S. PATENT DOCUMENTS

| | | | |
|---|---|---|---|
| 2010/0018184 A1* | 1/2010 | Gilchrist | F03H 1/0012 |
| | | | 60/202 |
| 2010/0155620 A1* | 6/2010 | Hutchison | H01J 37/20 |
| | | | 250/440.11 |
| 2010/0230767 A1* | 9/2010 | Takagi | B81C 1/00246 |
| | | | 257/417 |
| 2010/0270596 A1* | 10/2010 | Takagi | G01P 15/18 |
| | | | 257/254 |
| 2011/0156830 A1* | 6/2011 | Baik | B81C 1/00063 |
| | | | 331/154 |
| 2011/0189440 A1* | 8/2011 | Appleby | B22C 9/04 |
| | | | 428/156 |
| 2013/0285173 A1* | 10/2013 | Reimann | H04R 19/005 |
| | | | 257/416 |
| 2014/0306301 A1 | 10/2014 | Xie et al. | |
| 2015/0191345 A1 | 7/2015 | Boysel et al. | |
| 2016/0218726 A1* | 7/2016 | Overstolz | H03L 7/26 |

OTHER PUBLICATIONS

International Search Report and Written Opinion of the International Searching Authority issued in related Application Serial No. PCT/US2016/054402 on Nov. 3, 2016.

Non-Final Office Action issued in related U.S. Appl. No. 14/872,094 on Jul. 25, 2016.

International Search Report and Written Opinion issued in related International Application Serial No. PCT/US2016/054416 on Dec. 8, 2016.

\* cited by examiner

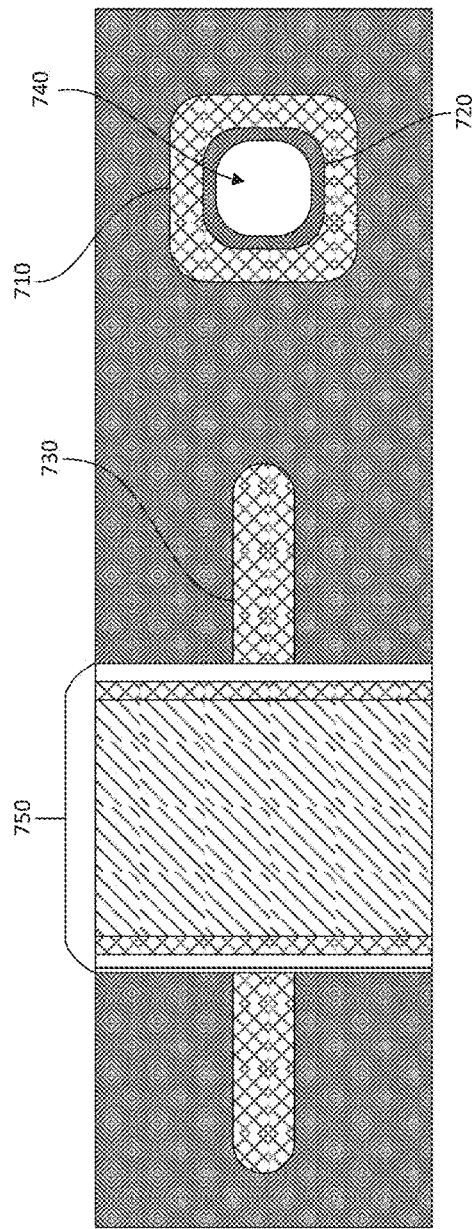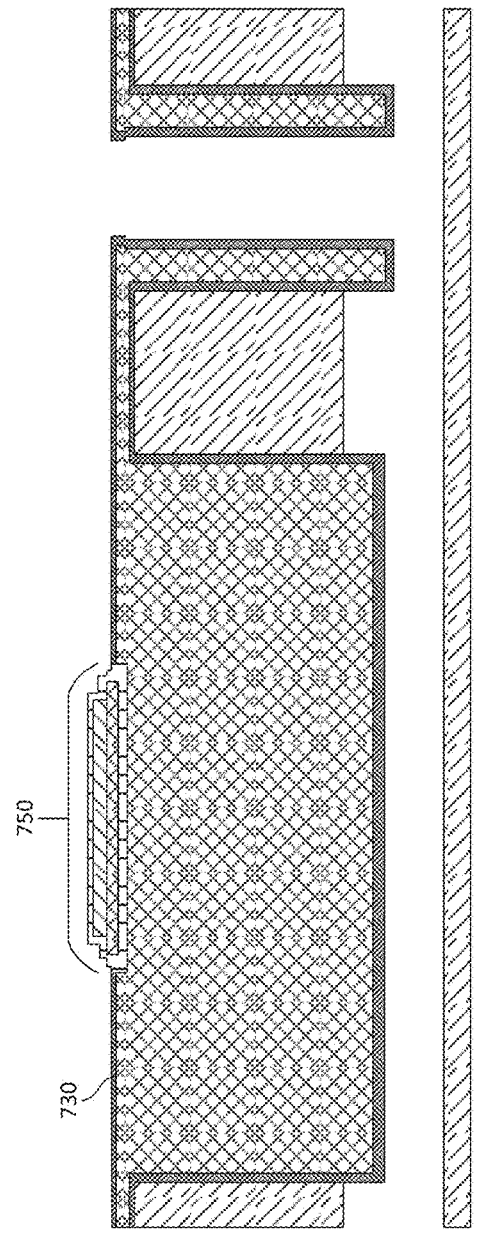
FIG. 7A
FIG. 7B

MEMS GRID FOR MANIPULATING STRUCTURAL PARAMETERS OF MEMS DEVICES

CROSS-REFERENCE TO RELATED APPLICATIONS

This application is related to co-pending U.S. patent application Ser. No. 14/872,094, entitled "Simplified MEMS Device Fabrication Process," filed on 30 Sep. 2015, which is incorporated herein by reference in its entirety.

TECHNICAL FIELD

The disclosed technology relates generally to semiconductor device fabrication, and more particularly, some embodiments relate to fabrication of microelectromechanical systems (MEMS).

DESCRIPTION OF THE RELATED ART

Since the late twentieth century, silicon on insulator (SOI) wafers have been the traditional technology used for the comb drive devices in the fabrication of microelectromechanical systems (MEMS). SOI wafers comprise a layer of silicon dioxide disposed between two layers of silicon. As an insulator, silicon dioxide, or silica, diminishes short channel effects in microelectronic devices.

It allows the manufacturing of moveable structures from the single crystalline silicon of a thin device layer. To release the mechanical structures, the sidewalls of the etched silicon structures are passivated. By using isotropic etching into the handle wafer silicon, the structures are then under-etched and their ends released. In this process, the structure width defines whether a structure becomes moveable or remains fixed. The structure or finger height usually is thin, due to the limit of the isotropic etching on the passivation layer.

BRIEF SUMMARY OF EMBODIMENTS

According to various embodiments of the disclosed technology, a method of fabricating MEMS devices is provided. The process combines the flexibility in structural design obtainable through surface micromachining with the ease of fabrication of bulk micromachining. The starting wafer can be SOI wafers, cavity SOI wafers or regular bulk substrate wafers. Deep trenches are etched into a starting substrate wafer and coated with an insulator, creating a base insulation layer that provides separation between the underlying substrate wafer and the layers of MEMS material to be deposited. The insulator is unlike the regular passivated layer, and it is thermal grown oxide, so can survive longer etching time. The MEMS device is constructed on top of the wafer or the device wafer of the SOI or cSOI wafer by deposition of thin layers of material in a specified pattern. After deposition of all the layers of material (depending on the design), specified locations of the wafer are etched in either a single or a multiple stage etch process. The etch process removes the wafer material beneath the base, separating the MEMS device from the underlying substrate wafer or handle wafer. In various embodiments, the etch process may also etch away sacrificial layers of material, freeing or "releasing" the MEMS structures, either at the same time as the separation of the entire MEMS device from the substrate wafer or as a second stage of the etch process. The trenches and the etch process result in a MEMS device of the desired thickness, reducing the need to perform wafer thinning. In addition, the separation process may separate individual MEMS device dies from each other, reducing the need for a separate dicing procedure. In some embodiments, the anisotropic etch may be designed to etch away the sacrificial layer of the MEMS device, releasing the structures, such as cantilevers and comb drives. Therefore, complex MEMS device fabrication is simplified, comb fingers can be fabricated very deeply to provide more force.

In addition, various embodiments in accordance with the present disclosure are directed to a method of fine-tuning the structural properties of a MEMS device. A MEMS grid with a variety of structural geometries may be created in the fabrication process by etching holes in specified areas on the MEMS device surface. The placement, shape, size, and number of holes making up the MEMS grid may be configured to allow for precise control of the structural properties of the MEMS device.

According to an embodiment of the disclosed technology, a method of MEMS device fabrication is provided. The method includes anisotropically etching a plurality of holes into a substrate wafer, and isotropically etching into the substrate wafer through the plurality of holes to separate the MEMS device from the substrate wafer.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any embodiments described herein, which are defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

FIG. 7A is a top view of a portion of an example MEMS device fabricated in accordance with the present disclosure.

FIG. 7B is a cross-sectional view of the top view of FIG. 7A.

Figure 1:
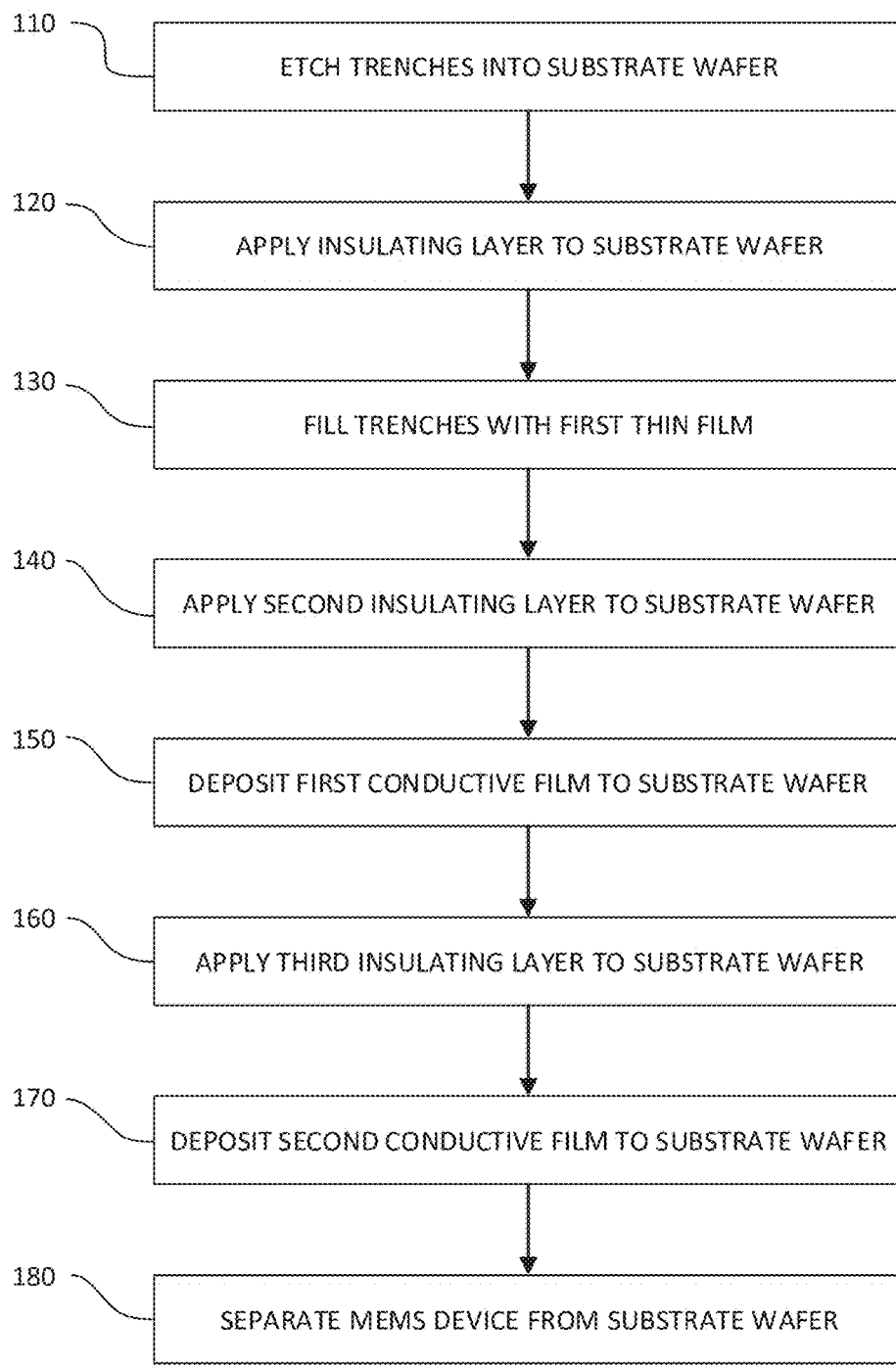
FIG. 1 is a flow diagram of an example fabrication method for MEMS devices in accordance with the present disclosure.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

Embodiments of the technology disclosed herein are directed towards devices and methods for fabricating MEMS devices. More particularly, the various embodiments of the technology disclosed herein relate to configurations and fabrication processes for MEMS devices. As will be described in more detail below, devices and methods in accordance with the present disclosure reduce costs associated with MEMS device fabrication, minimize damage from handling and processing, result in lighter weight MEMS devices, and allow for fine-tuning of the structural characteristics of the MEMS device.

MEMS devices are traditionally fabricated using SOI wafers. SOI wafers provide MEMS fabricators with flexibility in fabrication techniques. SOI wafers combine the benefits in performance and fabrication of bulk micromachining, where structures are created through etching into the substrate, with the comb structures and in-plane operation typical of surface micromachining, where structures are created through deposition of thin layers of material on top of a substrate. MEMS fabricators can etch into the top silicon layer to create structures, and can utilize the buried insulator layer as the sacrificial layer to release combs and comb-like structures. In other situations, the MEMS fabricators can etch into both sides of the MEMS device, using the insulator layer as an electrical isolator.

SOI wafers provide MEMS fabricators with the ability to control several parameters of MEMS fabrication. The aforementioned layers that make up an SOI wafer allow for precise control over film thickness through top and bottom layer etching and/or wafer thinning. Further, the silicon layers provide extra support during the fabrication process to limit warping of a MEMS device, while the silicon dioxide insulating layer provides benefits, such as a built-in sacrificial layer of material to ease the "release" of the MEMS device. Moreover, the insulating layer provides additional control of the resistivity of the MEMS device.

MEMS designers may use an insulator layer as a sacrificial layer, which is etched away following fabrication to "release" the MEMS structures, such as cantilevers. The insulator layer (which is buried) also acts as a natural etch stop, meaning that a fabricator could choose an SOI wafer with a particular top layer thickness. Further, the insulator layer provides electrical isolation between the top and bottom layers.

For the SOI wafers with or without cavity, wafer thinning is necessary process. The two most common methods of wafer thinning are conventional grinding, or thinning, and chemical-mechanical planarization (CMP). Conventional thinning utilizes a grind wheel to remove material from the silicon wafer. The grind wheel is applied to the wafer until the desired thickness is achieved. CMP utilizes an abrasive chemical slurry and a polishing pad. The chemical slurry eats away at the wafer, while the polishing pad removes the excess material leaving a planar, smooth surface.

Since multiple MEMS devices (like most semiconductor fabrication) are fabricated on a single wafer, these devices need to be separated from one another. Traditional die preparation can use either a wet or a dry procedure by scribing and then breaking, mechanical cutting with a dicing saw, or laser cutting. Die preparation, however, may cause chipping and marring of the MEMS device and can exert a vibrating load on the device. In addition, the die preparation and wafer thinning processes each require additional wafer handling during the fabrication process; this increases the potential for mishandling.

Fabrication processes in accordance with the present disclosure overcome these and other downsides to traditional MEMS fabrication processes.

FIG. 1 is a flow diagram of an example fabrication process 100 for a MEMS device in accordance with the present disclosure. FIGS. 2A-6C will be referenced in conjunction with FIG. 1 for ease of explanation.

At 110, trenches are etched into a substrate wafer, which can be bulk wafer, SOI wafer, and cSOI wafer. The trenches (which will be filled once fabrication is completed) provide structural support to the MEMS device. In addition, the trenches may provide electrical contacts for electrical routing in various embodiments.

Figure 2A:
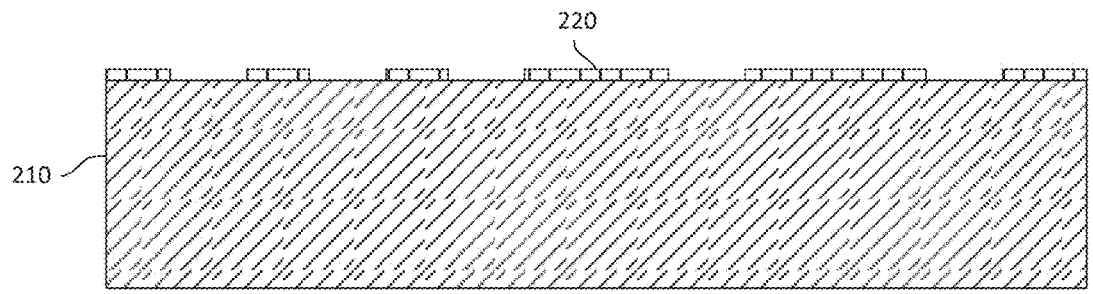
FIGS. 2A, 2B, and 2C illustrate an example trench etching process of an example fabrication method in accordance with the present disclosure.
Figure 2B:
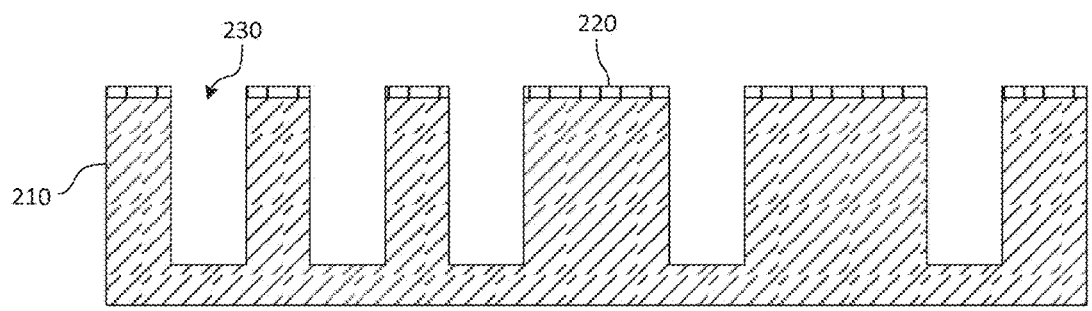
Figure 2C:
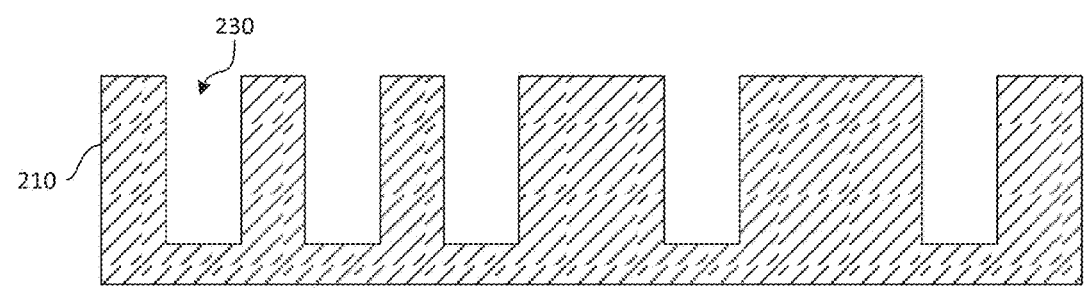

FIGS. 2A, 2B and 2C illustrate an example method of etching the trenches into the substrate that may be used at 110. As shown in FIG. 2A, a layer of photoresist material, or resist, 220 is deposited onto a substrate wafer 210. In various embodiments, the substrate wafer 210 may be a bulk wafer, SOI wafer, and cSOI wafer of semiconductor material. Some non-limiting examples of semiconductor material include: silicon; gallium arsenide; germanium; gallium nitride. As should be apparent to one of ordinary skill in the art, the substrate wafer 210 may be any material suitable as a substrate in semiconductor and MEMS fabrication. A layer of lithographic resist 220 is deposited on the surface of the substrate wafer 210. To ensure that the trenches are etched in the desired location, a mask is used to apply the resist 220 in a desired pattern. During fabrication, those areas of the substrate wafer 210 unprotected by the resist 220 will be removed.

In some embodiments, a layer of protective material (not shown) may be applied underneath the resist 220 prior to etching the trenches. In various embodiments, the protective material may be silicon oxide or silicon nitride. In various embodiments, the protective material may be a hardmask. In various embodiments, the protective material may be a material with an ultra-slow etch rate to help protect the area of the substrate wafer 210 protected by the resist 220. In various embodiments, the protective layer may be used to account for any discrepancy in the etch rate of the etching compound used. The protective layer may be applied to the substrate wafer similar to the application of the insulating layer described below in regards to FIG. 3.

After the resist 220 has been applied, trenches 230 are etched into the substrate wafer 210, as shown in FIG. 2B. In various embodiments, a dry etching technique may be used to etch away the substrate material 210. In some embodiments, sputtering etching may be used to create the trenches 230. In various embodiments, a deep reactive-ion etching (DRIE) process may be used. DRIE creates deep penetration, steep sidewalls, and achieves high aspect ratios. In other embodiments, other dry etching methods may be used, such as reactive ion etching (RIE). In various embodiments, an anisotropic wet etching process may be used to etch the trenches 230. After etching the trenches 230, the resist 220 is removed from the substrate wafer 210, as shown in FIG. 2C.

Similar trench etching has been used for "suspended trench isolation" in bulk silicon wafers. Suspended trench isolation is a technique of creating isolation regions within a bulk silicon wafer to achieve similar isolation as available in SOI wafer technology. As traditionally used, trenches are etched into the silicon wafer and subsequently filled with an insulating material, such as silicon nitride. The trenches are utilized to provide horizontal isolation between MEMS structures etched directly into the bulk silicon wafer.

Use of trenches in this way, however, falls to eliminate the need for die preparation. As discussed above, multiple MEMS devices are generally prepared on the same silicon wafer. The suspended trench isolation method described above still requires die preparation as the actual silicon wafer is utilized in the MEMS devices. Wafer thinning may still need to be conducted as well, if the silicon wafer is not properly selected to provide the proper dimensions. Moreover, the MEMS device created comprises the silicon wafer material, with the isolation trenches providing only horizontal isolation between MEMS structures etched into the silicon wafer. Manufacturing processes in accordance with the technology of the present disclosure creates a MEMS device independent of the underlying silicon wafer, with the trenches representing MEMS structures themselves. Suspended trench isolation is unnecessary and inapposite to the manufacture of MEMS devices in accordance with the present disclosure.

Referring back to the example flow diagram of FIG. 1, after etching the trenches into the substrate wafer, an insulating layer is applied to the substrate wafer at 120. The insulating layer is used to mechanically and electrically isolate the substrate wafer from the thin films of material yet to be deposited to create the MEMS device. The insulating layer provides many of the benefits. The insulating layer acts as a boundary, separating the forthcoming-deposited layers comprising the MEMS device from the underlying substrate wafer. This is unlike the suspended trench isolation method discussed above, which only provides isolation between MEMS structures etched into the substrate wafer. As will be seen later on, the insulating layer also assists in the separation process of the resulting MEMS device from the underlying substrate wafer.

In various embodiments, the insulating layer covers all the exposed surfaces of the substrate wafer, including the interior walls of the trenches produced at 110. In this way, most of the later-deposited thin films of material will contact the substrate wafer. In other embodiments, the insulating layer may not cover the entire surface of the substrate wafer.

In some embodiments, the insulating layer may be grown on the substrate wafer through oxidation or nitridation. For example, if the substrate wafer were a silicon wafer, oxidation would result in a layer of silicon dioxide forming on the substrate wafer, referred to generally as thermal oxide. The thermal oxide replaces some of the silicon from the substrate wafer. In some cases, the layer of silicon replaced by the thermal oxide could be as much as 46% of the depth of the thermal oxide.

In other embodiments, the insulating layer may be deposited on the substrate wafer via a deposition method. Some non-limiting examples of deposition methods include: atomic layer deposition; low-pressure chemical vapor deposition (LPCVD); plasma-enhanced chemical vapor deposition (PECVD); epitaxy; sputtering; pulsed laser disposition (PLD); or other deposition method.

Figure 3A:
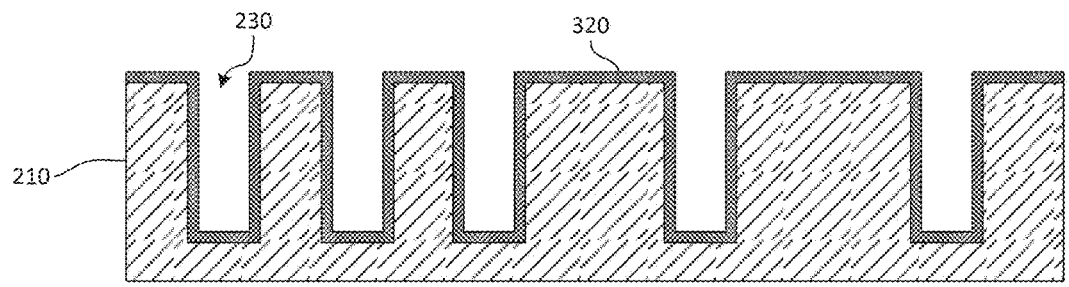
FIGS. 3A, 3B, and 3C illustrate an example trench-filling process of an example fabrication method in accordance with the present disclosure.
Figure 3B:
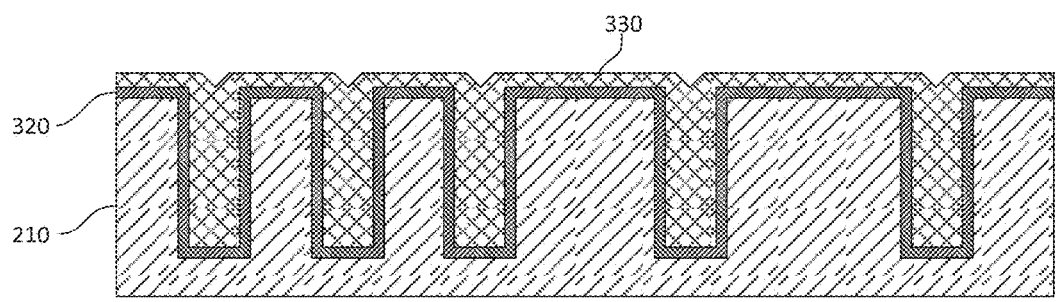

Referring back to the example flow diagram of FIG. 1, the trenches are filled at 130. Filling in the trenches provides structural support to the MEMS device. An example process of filling the trenches 230 is illustrated in FIGS. 3A and 3B. As shown in 3B, a MEMS base material 330 is deposited onto the substrate wafer 210. The insulating layer deposited as discussed above with regards to 120 is shown as insulator 320 in FIG. 3A. The MEMS base material 330 should mechanically strong. Non-limiting examples of the MEMS base material 330 include: polysilicon; germanium; aluminum; titanium; metal alloys; among others. In various embodiments, the MEMS base material 330 may be a conductive material.

In some embodiments, the MEMS base material 330 may be doped to tailor the electrical properties of the material. In various embodiments, the MEMS base material 330 may be deposited by LPCVD, PECVD, epitaxy, sputtering, PLD, atomic layer deposition, cathodic arc physical vapor deposition (arc-PVD), thermal vaporization, or any other suitable deposition method.

Figure 3C:
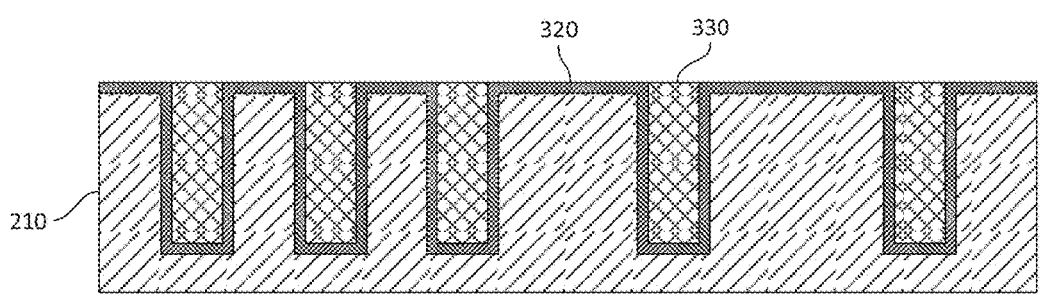

In various embodiments, after the trench filling process, the MEMS base material 330 may not have a smooth surface. The unevenness may adversely affect later layer deposition and cause unevenness in the surface of the MEMS device. Accordingly, in some embodiments the MEMS base material 330 may be removed via planarization to ensure a smooth surface, as illustrated in FIG. 3C. In some embodiments, the planarization may be performed using a blanket etching method. In various embodiments, the planarization may be performed by RIE, CMP, or a combination of both. In some embodiments, the planarization may remove all of the MEMS base material 330 not contained within the boundaries of the trenches 230, wherein the top boundary of the trench would be where the trench opening is flush with the insulator 320.

Referring back to FIG. 1, a second insulating layer is applied to the substrate wafer at 140. The application method of the second insulating layer may be similar to the application of the first insulating layer described above with regards to 120.

Figure 4A:
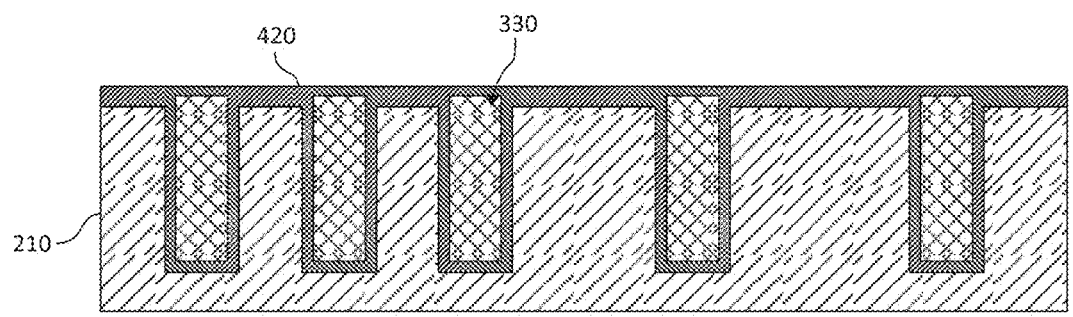
FIGS. 4A, 4B, and 4C illustrate an example insulating layer patterning process of an example fabrication method in accordance with the present disclosure.
Figure 4B:
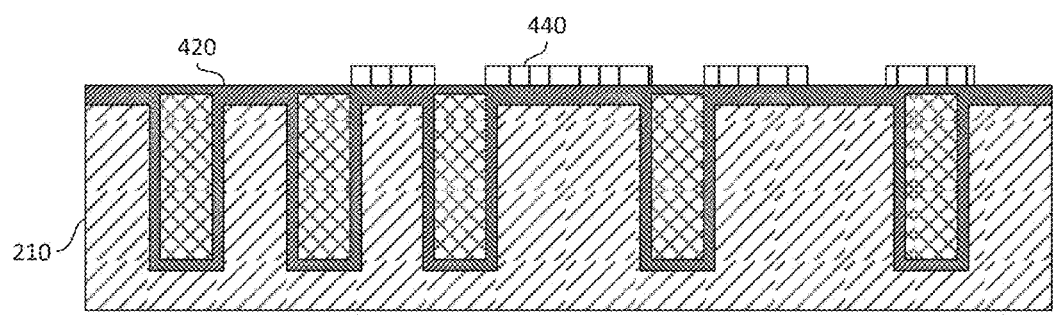
Figure 4C:
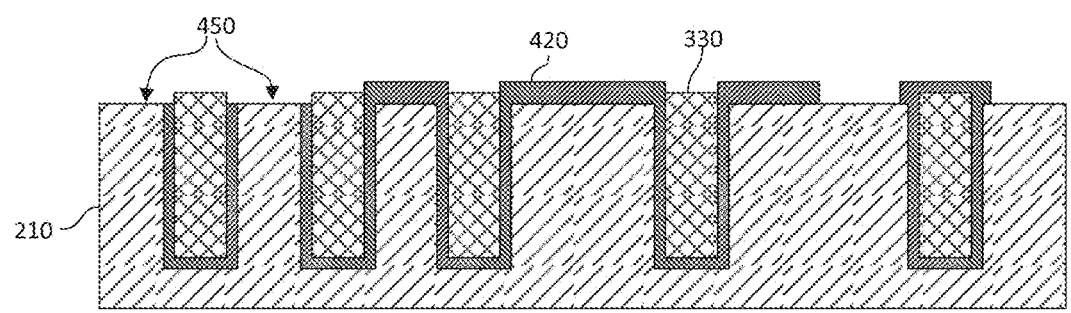

As will become clearer below, it would be beneficial in various embodiments to leave exposed portions of the substrate wafer surface. Accordingly, in some embodiments the second insulating layer may be patterned in a way similar to the patterning used to create the trenches at 110. FIGS. 4A, 4B, and 4C illustrate an example patterning process. As shown in FIG. 4A, the second insulating layer 420 is applied to the substrate wafer 210. The second insulating layer 420 covers the MEMS base material 330 used to fill the trenches at 130. In some embodiments, the second insulating layer 420 may be the same material applied at 120. In other embodiments, the second insulating layer 420 may be a different type of insulating material. As shown in FIG. 4B, a resist 440 is deposited on the second insulating layer 420. The pattern in which the resist 440 is deposited may be different from the pattern used at 110 to create the trenches. In some embodiments, the pattern for the second insulating layer 420 may be substantially the same as the pattern used for the trenches. In various embodiments, the pattern used for the second insulating layer 420 may expose some or all of the areas protected by the pattern used in 110 to make the trenches. In the example illustrated in FIG. 4B, the resist 440 is patterned to protect the second insulating layer 420 deposited between the three interior trenches and the top of the fifth trench, but leaves exposed the rest of the second insulating layer 420.

FIG. 4C illustrates the results of the etching process. As illustrated, the second insulating layer 420 is removed in areas not covered by the resist 440. In some embodiments, the etching process may be designed to remove both the first insulating layer 320 and the second insulating layer 420 from the exposed areas, leaving the surface of the substrate wafer 210 exposed as seen in regions 450. In this way, the insulating layer will not interfere with the etching process of 180, discussed below.

Referring back to the flow diagram of FIG. 1, the first conductive layer may be deposited on the substrate wafer at 150. MEMS devices fabricated using surface micromachining comprise thin layers of material deposited on top of each other to create distinct components designed to provide an entire system in a micro-scale package. For MEMS devices, such as actuators, having different layers of conductive material allows for isolation between different actuation areas of the device. The thin films may be deposited in several ways. In some embodiments, the first conductive layer may be deposited using either a physical or a chemical deposition method. Some non-limiting examples of deposition methods include: physical vapor deposition (PVD); cathodic arc deposition (arc-PVD); electron beam PVD (e-beam); evaporative deposition; sputtering; thermal vaporization; low-pressure chemical vapor deposition (LPCVD); plasma-enhanced CVD (PECVD); epitaxy; electroplating; atomic layer deposition.

Figure 5A:
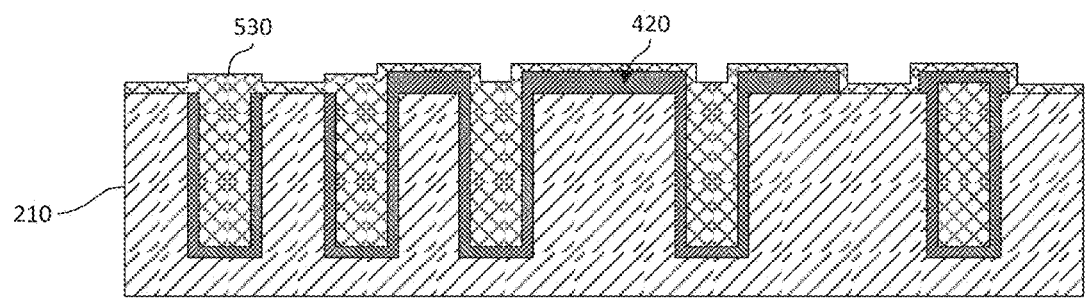
FIGS. 5A and 5B illustrate an example deposition and patterning process of an example fabrication method in accordance with the present disclosure.
Figure 5B:
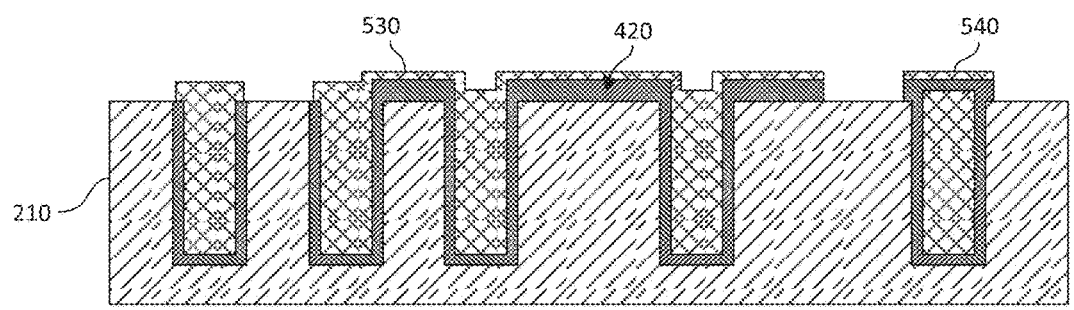

An example of the deposition and patterning process of the first conductive film 530 onto the substrate wafer 210 is illustrated in FIGS. 5A and 5B. As shown in FIG. 5A, the first conductive film 530 is deposited on top of the substrate wafer 210. In some embodiments, the first conductive material 530 may be a different material from the material used to fill the trenches at step 130. In other embodiments, the first conductive layer 530 and the trench material may be the same material. Any conductive material suitable for use in semiconductor devices is suitable to be used as the first conductive layer 530. In some embodiments, the first conductive layer 530 may include one or more of: polysilicon; gallium arsenide; aluminum; tungsten; titanium; copper; zinc; lead; tin; germanium; or other metals. In some embodiments, alloys of metals may be used. In various embodiments, the material used as the first conductive layer 530 may be doped to tailor the electrical properties of the material.

In some embodiments, the first conductive layer 530 may include multi-layered conductive material, as used in semiconductor fabrication. Such multi-layered conductive material comprises an underlying layer used as an anti-stiction layer (meant to combat the effect of surface adhesion forces between the substrate and the MEMS structures) and a top layer (meant to be the conductive layer). Non-limiting examples of materials used as underlying layers in multi-layered conductive material include: titanium; nickel; chromium, titanium nitride; among others. Non-limiting examples of materials used as the top layer in multi-layered conductive material include: aluminum; gold; copper; among others. In various embodiments, the underlying material may be chosen based on its ability to prevent "spiking," where the conductive material penetrates into the substrate material and results in shorting.

The first conductive film 530 may be patterned to create discrete components within the MEMS device. The patterning process may be similar to the patterning process discussed above with regards to 110 and 140. Although the resist pattern is not shown, comparison of FIGS. 5A and 5B illustrates the resist pattern utilized. In some embodiments, the first conductive film 530 may be removed from the same areas where the second insulating layer was removed in 140.

The example pattern shown in FIG. 5B illustrates that the first conductive layer 530 is connecting the three interior trenches. In addition, a strip 540 of the first conductive film 530 sits on top of, but is electrically isolated from, the trench to the right-side of FIG. 5B. In some embodiments, separate electrical routing lines may be created by patterning the insulating layer 420 and the first conductive film 530 accordingly to create electrical isolation between the desired routes, while maintaining a mechanical connection between all the components of the MEMS device.

Although the deposition and patterning process of the first conductive film 530 has been described in regards to the example process illustrated in FIGS. 5A-B, other processes of creating interconnections between portions of the MEMS device may be utilized. In various embodiments, back end of the line (BEOL) may be utilized to form the first conductive film 530.

Referring back to the flow diagram of FIG. 1, a third insulating layer is applied to the first conductive layer and the substrate wafer at 160. The third insulating layer may be patterned in a manner similar to the other insulating layers discussed above. The third insulating layer may be used to further isolate the first conductive layer from subsequent conductive layers, or to provide a region for an electrical connection between different layers.

After the third insulating layer is applied, a second conductive film may be deposited on the substrate wafer at 170. The same discussion from above in regards to FIGS.

5A, 5B, and reference numbere 150 from FIG. 1 applies to the deposition of the second conductive film.

Where greater than two conductive layers are required for the MEMS device, 140-170 of the example fabrication process may be repeated until all the layers required for the MEMS device have been deposited on the substrate wafer. The process is scalable to fit the needs of the MEMS designer.

Figure 6A:
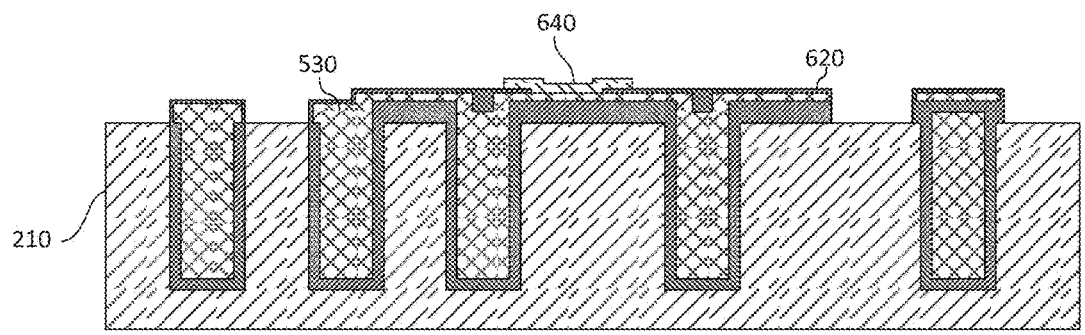
FIGS. 6A, 6B, and 6C illustrate an example separation process of an example fabrication method in accordance with the present disclosure.
Figure 6B:
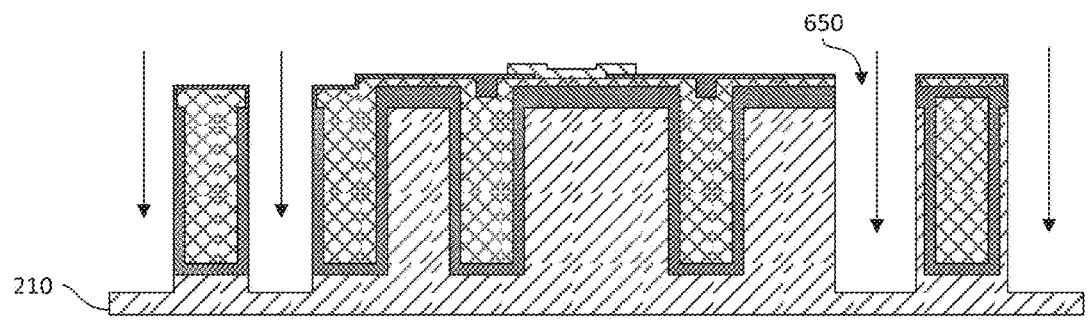
Figure 6C:
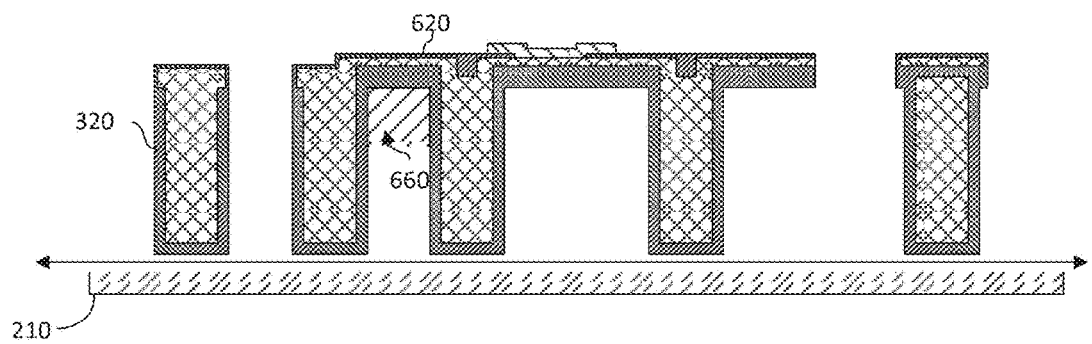

After constructing the MEMS device, the device may be freed from the substrate wafer at 180. In various embodiments, the separation process of 180 may include two etching processes—an anisotropic etch and an isotropic etch. An example separation process is illustrated in FIGS. 6A, 6B, 6C. FIG. 6A illustrates the results of an example two-conductive layer fabrication. The third insulating layer 620 from 160 (FIG. 1) and the second conductive film 640 are shown. In the example illustrated, the second conductive film 640 and the first conductive film 530 are shown as mechanically and electrically connected (no insulating layer 620 between them).

As shown in FIG. 6B, a first anisotropic etch is performed. As can be seen in the illustrated example, the anisotropic etch occurs in the regions where the substrate wafer's 210 surface remained exposed during the example process. In this way, the directional etch shown in FIG. 6B could be accomplished with less complexity, as there is only a single material that needs to be etched. This anisotropic etch results in a plurality of holes 650 in the MEMS device. This results in a lighter weight MEMS device, as material has been removed from the device. The location and shape of the holes comprise a "MEMS grid," which MEMS designers can manipulate to attain desired structural characteristics for the entire device, or varying structural characteristics for different MEMS structures and areas. The MEMS grid shall be discussed in more detail below with regards to FIGS. 12-19.

FIG. 6C illustrates the isotropic etch of the separation process. The isotropic etch is possible due to the MEMS grid disposed in the MEMS device. The holes provide the ability to introduce the isotropic etching agent into areas of the substrate wafer 210 efficiently, resulting in greater control of the isotropic etching process. During the isotropic etch, the substrate wafer 210 material connected to the first insulating layer 320 is etched away, freeing the MEMS device from the substrate wafer 210. In some embodiments, a portion 660 of the substrate wafer 210 may remain to provide additional structural support to the MEMS device.

In various embodiments, the separation process may be conducted through the use of a single etch, such as an isotropic etch or an anisotropic etch with a proper aspect ratio. In such embodiments, the MEMS device would be both separated from the substrate wafer as well as have excess material between the filled trenches etched away, as desired.

In some embodiments, the isotropic etch may also perform the "release" portion of MEMS fabrication at the same time as separating the MEMS device from the substrate wafer. In surface micromachining MEMS fabrication, moving structures, such as cantilevers, are supported during the fabrication process by a sacrificial layer of material. The sacrificial layer is typically an insulating layer. In order to have range of motion, the sacrificial layer must be etched away, releasing the structure to move. In traditional MEMS fabrication, the releasing step must be performed after the wafer thinning and dicing processes. In some embodiments, this releasing step may be accomplished with the anisotropic etch of the separation process at 180 of FIG. 1. The anisotropic etch could be configured with the proper aspect ratio to ensure that the sacrificial layer is removed without impacting the MEMS structure. In such embodiments, the MEMS device would not only be separated from the substrate wafer, but would also be "released." In various embodiments, the releasing step may be accomplished by the isotropic etch of the separation process at 180 of FIG. 1. In various embodiments, the releasing step may be accomplished by both each portion of the separation process at 180 of FIG. 1. Accordingly, embodiments of the present disclosure enables the use of pick and place machines straight from the substrate wafer as the MEMS device would be ready for use once separated from the wafer.

FIG. 7A shows a top view of a portion of an example MEMS device fabricated in accordance with the present disclosure. As shown in FIG. 7A, the shape of the trenches etched into the substrate wafer at 110 of FIG. 1 may vary. In some embodiments, a trench 710 may be a square, circular, or other shaped ditch surrounding an area 720. In some embodiments, the area 720 is the exposed surface of the substrate wafer etched away during the separation process 180 of the example process of FIG. 1, resulting in the hole 740. In some embodiments, a trench 730 may be a slot. In various embodiments, the slot 730 may be straight, curved, or some other shape.

FIG. 7B is a cross-sectional view of the top view from FIG. 7A. As seen in FIG. 7B, the conductive layers and insulating layers included in area 750 sit on top of the slot trench 730. In some embodiments, slot trenches 730 may be used to provide additional structural support. In some embodiments, slot trenches 730 may be utilized to provide a connection between two electrically isolated portions of the MEMS device.

Figure 8:
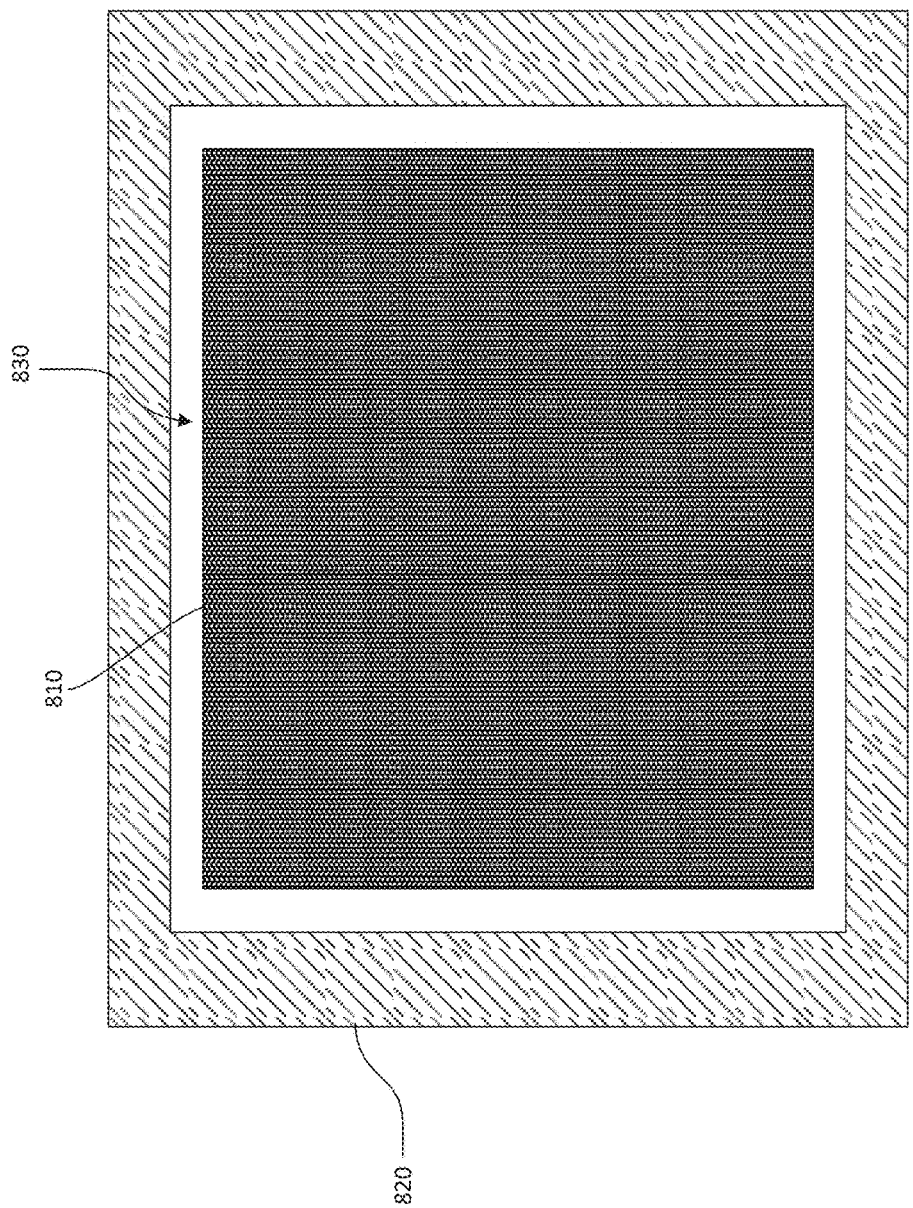
FIG. 8 illustrates an example etching of a boundary trench in accordance with the present disclosure.

In some embodiments, the isotropic etch may be designed to result in a MEMS device of the desired thickness without the need for any post-wafer thinning processing. Accordingly, the fabrication is simplified by eliminating the need to conduct additional wafer thinning steps to achieve the desired thickness. Further, the separation process at 180 may not only separate the MEMS device from the substrate wafer, but may also separate the individual MEMS dies from each other. In such embodiments, the anisotropic etching process may be configured to etch into the substrate wafer around the dimensions of the MEMS device, as illustrated in FIG. 8. In this way, the anisotropic etch would result in a boundary opening 830 between the MEMS device 810 and the substrate wafer 820, thus freeing the MEMS device not only from the substrate wafer 820 below, but also on the sides. Therefore, additional die preparation steps are unnecessary as the MEMS device die is freed completely from the substrate wafer.

Figure 9A:
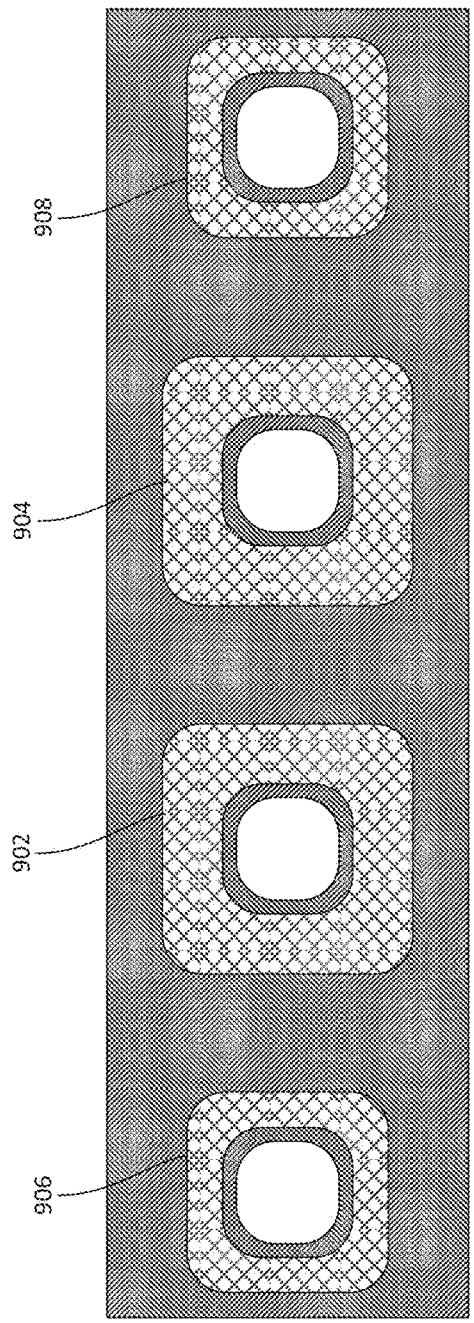
FIGS. 9A and 9B illustrate an example process of creating varying depths for trenches in accordance with the present disclosure.
Figure 9B:
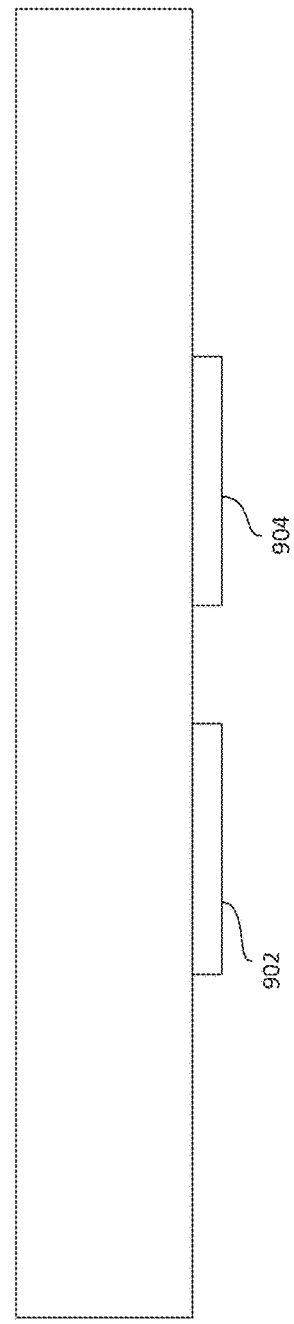

In addition to varying in shape, the trenches may also vary in size. By widening the trench, a deeper etch is possible. FIGS. 9A and 9B illustrate this technique. In various embodiments, as shown in FIG. 9A, the trenches 902, 904 are wider than the trenches 906, 908. During the etching process, the trenches 902, 904 will have a greater depth to reach the equivalent aspect ratio as trenches 906, 908. Accordingly, the depth results in protrusions 910, 912, as shown in FIG. 9B. In some embodiments, the protrusions 910, 912 may be used to provide separation between the MEMS device and other components, such as a circuit board, when the MEMS device is included in a device package. A non-limiting example of such a use may be to provide separation between a MEMS device and a circuit board in a moving image sensor package, like the moving image sensor package for optical image stabilization (OIS)

disclosed in co-pending U.S. patent application Ser. No. 14/692,662, entitled "Moving Image Sensor Package," filed Apr. 21, 2015.

Figure 10A:
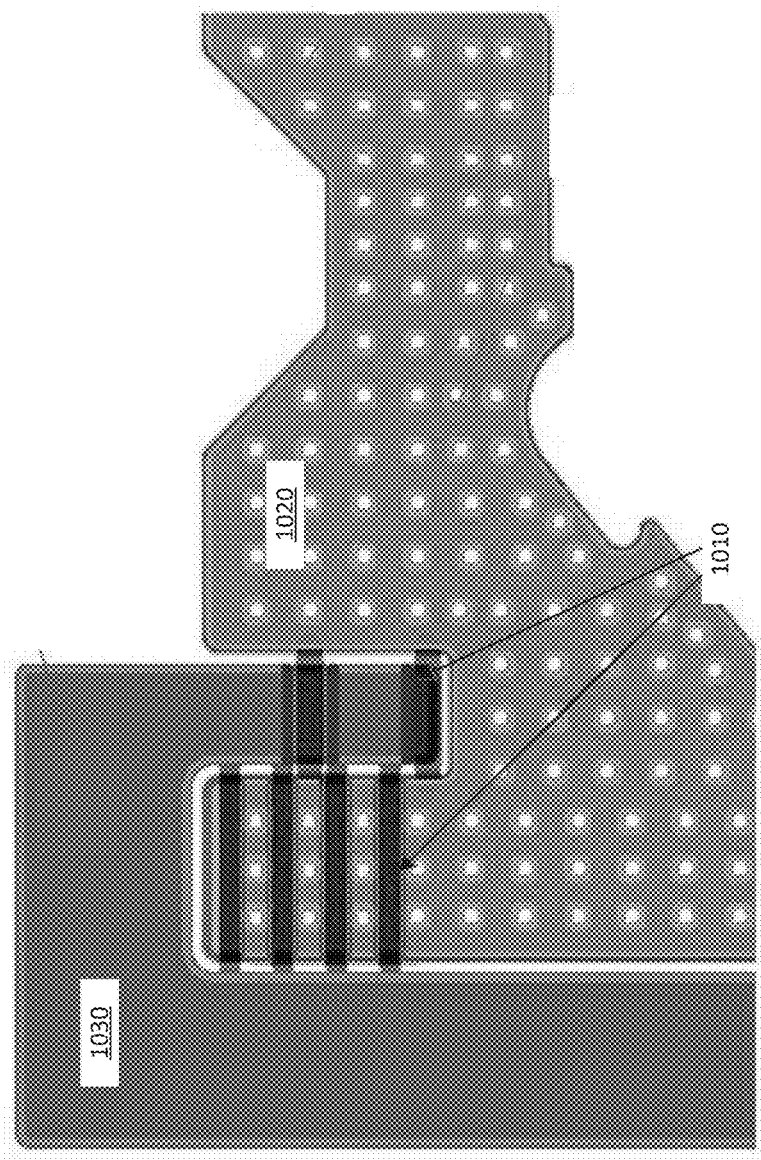
FIGS. 10A, 10B, and 10C illustrates an example mechanism for securing the MEMS device following separation from the substrate wafer in accordance with the present disclosure.
Figure 10B:
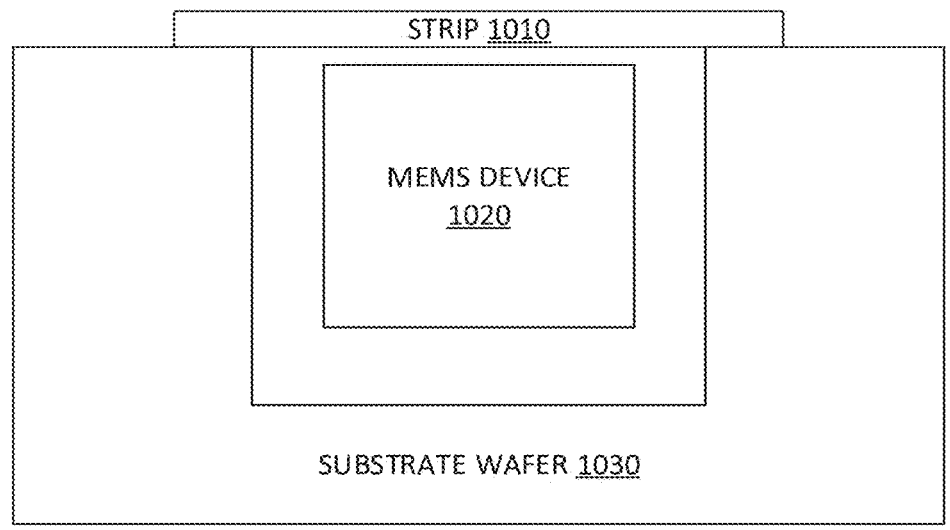

After separation from the substrate wafer, it is possible that the MEMS device could either drop down onto the substrate wafer or pop up and out of location, resulting in damage to the MEMS device. FIGS. 10A and 10B illustrate an example method of keeping the die from popping out following the separation process of 180 of FIG. 1. As shown in FIG. 10A, one or more strips 1010 rest above the MEMS device 1020. When separation occurs, a sacrificial layer (not shown) is etched away such that the one or more strips 1010 remain connected to the substrate wafer 1030 and are positioned over the MEMS device 1030 without making contact, as illustrated in FIG. 10B. In this way, the MEMS device 1020 is prevented from popping up and being potentially damaged. If the MEMS device 1020 was to move upwards, it would make contact with the one or more strips 1010, preventing the MEMS device 1020 from popping all the way out of position. The one or more strips 1010 may be placed in such a way that no vital MEMS structures of the MEMS device 1020 would be impacted, and that the distance which the MEMS device 1020 could travel is minimal to prevent damage resulting from the stopping function of the one or more strips 1010. In some embodiments, the one or more strips 1010 may be deposited during the deposition at 140 and/or 160 of FIG. 1. In some embodiments, the one or more strips 1010 may be made of the same material as the first or second conductive films. In various embodiments, one or more strips 1010 may be located at each corner of the MEMS device 1020, to avoid partial popping out by the MEMS device 1020. In other embodiments, the strips 1010 may be deposited on less than all the corners of the MEMS device 1020. The strip also can be solidly attached to both sides and break off at specifically designed north area when the MEMS devices have been picked up.

Figure 10C:
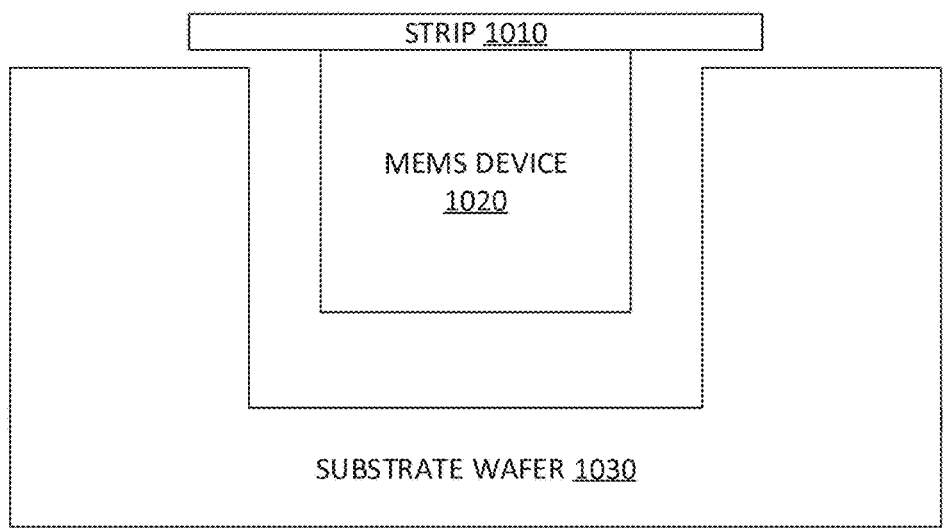

In various embodiments, the one or more strips 1010 may be configured to prevent the MEMS device 1020 from dropping onto the substrate wafer 1030. As illustrated in FIG. 10C, the one or more strips 1010 may be deposited on the MEMS device 1020, and a sacrificial layer may rest between the ends of the one or more strips 1010 and the substrate wafer 1030. After separation, the sacrificial layer is etched away, separating the one or more strips 1010 from the substrate wafer 1030. If the MEMS device 1020 were to drop, the one or more strips 1010 would contact the substrate wafer 1030, preventing the MEMS device 1020 from falling down on top of the underlying portion of the substrate wafer 1030. In various embodiments, a combination of the one or more strips 1010 illustrated in FIGS. 10B and 10C may be employed.

Figure 11A:
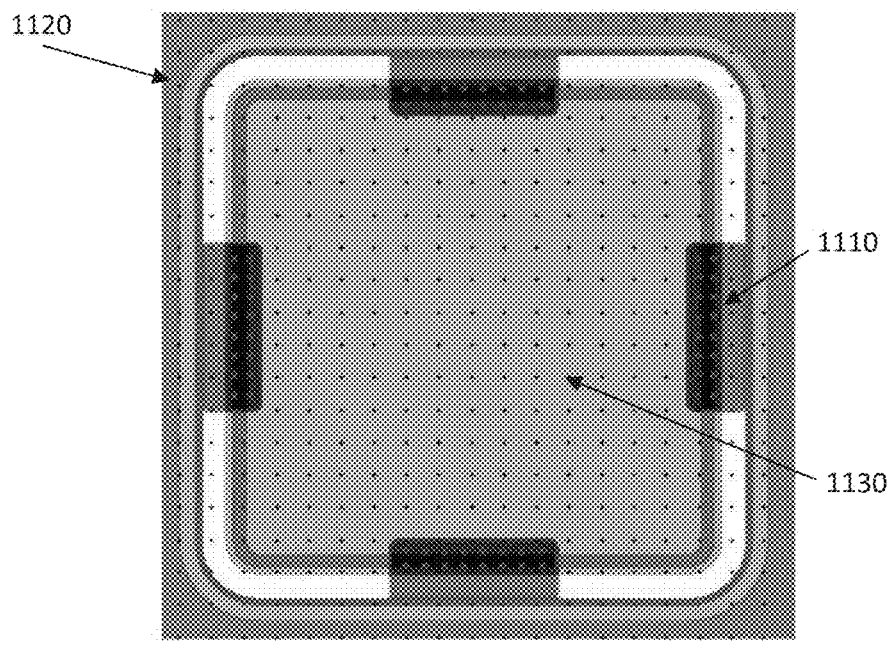
FIGS. 11A and 11B illustrate another example mechanism for securing the MEMS device following separation from the substrate wafer in accordance with the present disclosure.
Figure 11B:
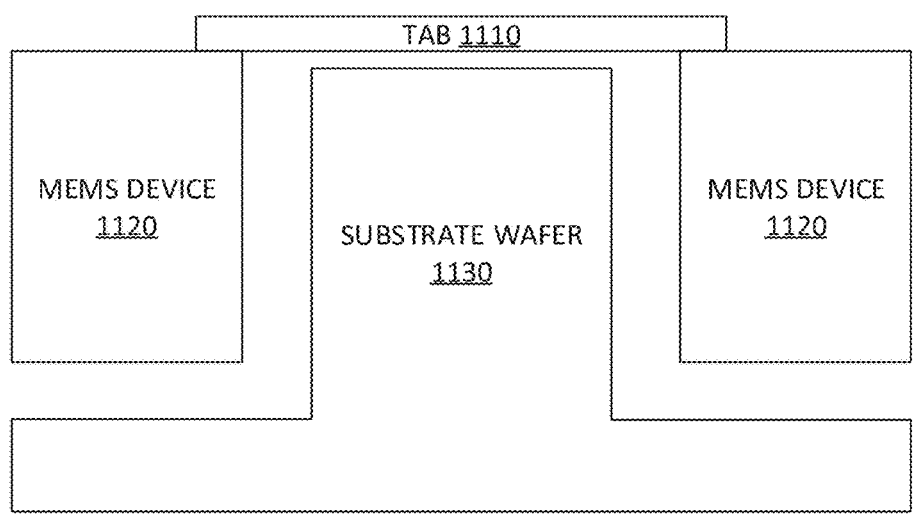

FIGS. 11A-B illustrate another example mechanism to keep the MEMS device from dropping down onto the substrate wafer after separation from the substrate wafer. As shown in FIG. 11, one or more tabs 1110 are deposited on the MEMS device 1120. After separation, if the MEMS device 1120 drops down, the one or more tabs 1110 would rest on a portion of the substrate wafer 1130, preventing the MEMS device 1120 from dropping onto the underlying substrate wafer. FIG. 11B is a cross-sectional view of the example configuration of FIG. 11A. In some embodiments, the one or more tabs 1110 may be deposited during 140 and/or 160 of the example process of FIG. 1. In some embodiments, the one or more tabs 1110 may be made of the same material as the first or second conductive films.

As discussed above, the surface of the MEMS device in accordance with the present disclosure takes on a particular pattern. This pattern is referred to herein as the MEMS grid. MEMS devices having a MEMS grid in accordance with the present disclosure are lighter as there is less material remaining in the finished MEMS device. Traditional processes, like those using SOI wafers or suspended trench isolation methods, retain portions of the underlying substrate wafer in the MEMS structures, resulting in greater weight with the additional material.

The MEMS grid in accordance with the present disclosure, however, may result in a negative impact on structural integrity due to the lesser amount of material present to provide support. The inventors have discovered, however, that by manipulating the parameters of the MEMS grid—such as the shape or shapes used to define the trenches and the alignment of the trenches—it is possible to fine-tune the structural characteristics of the MEMS device. By adjusting the parameters of the MEMS grid, a lighter MEMS device may be fabricated without sacrificing required structural and mechanical characteristics, and in some cases providing the opportunity to tailor the structural and mechanical characteristics of particular MEMS structures within the MEMS device in a way not previously possible.

The MEMS grid of the present disclosure differs from other grids utilized in MEMS fabrication, such as with the suspended trench isolation discussed above. In these other fabrication methods, the grid serves only to enable release of certain structures. As discussed throughout the present disclosure, however, the resulting device utilizes the underlying substrate, so there is less of an impact on the structural integrity of the MEMS device. MEMS grids in accordance with the present disclosure are the result of a separation process whereby the MEMS device is freed from the underlying substrate wafer. Accordingly, the grid serves not only to assist in release of MEMS structures, but actually forms the structural portion of the MEMS device itself.

Figure 12:
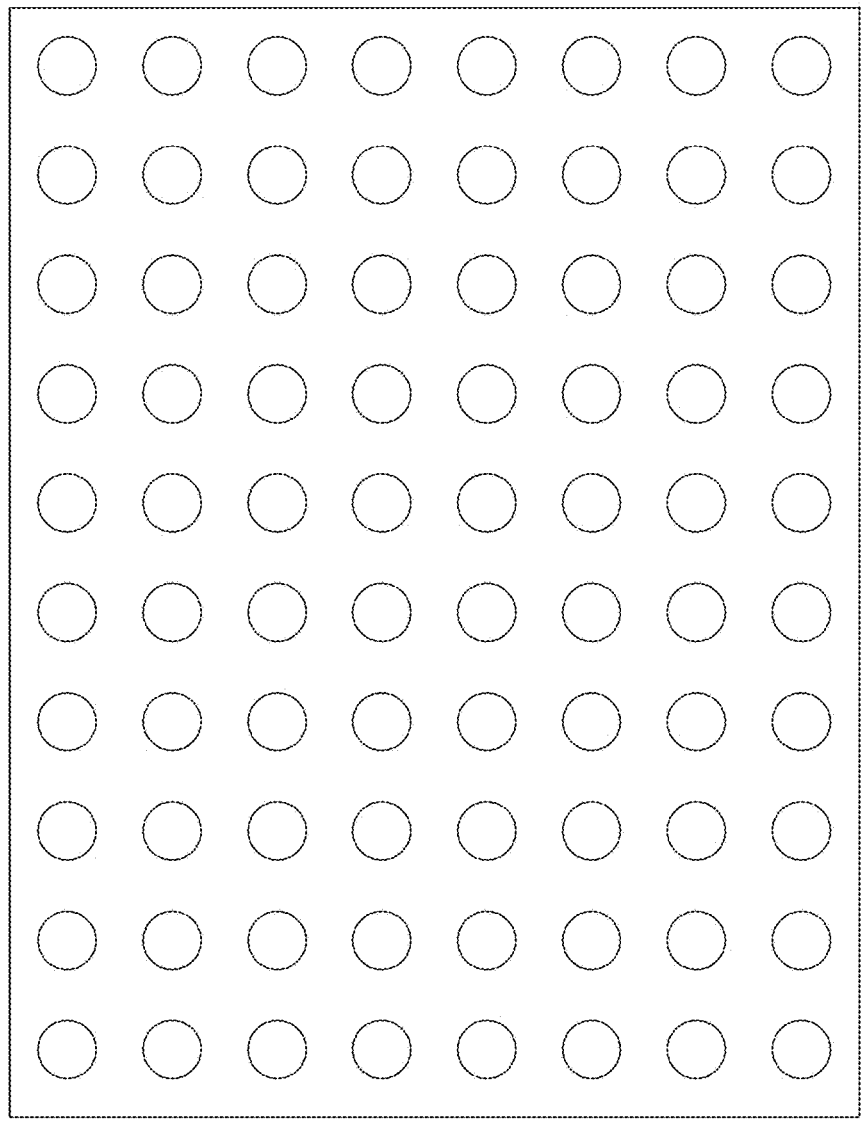
FIG. 12 illustrates an example MEMS grid in accordance with the present disclosure.
Figure 13:
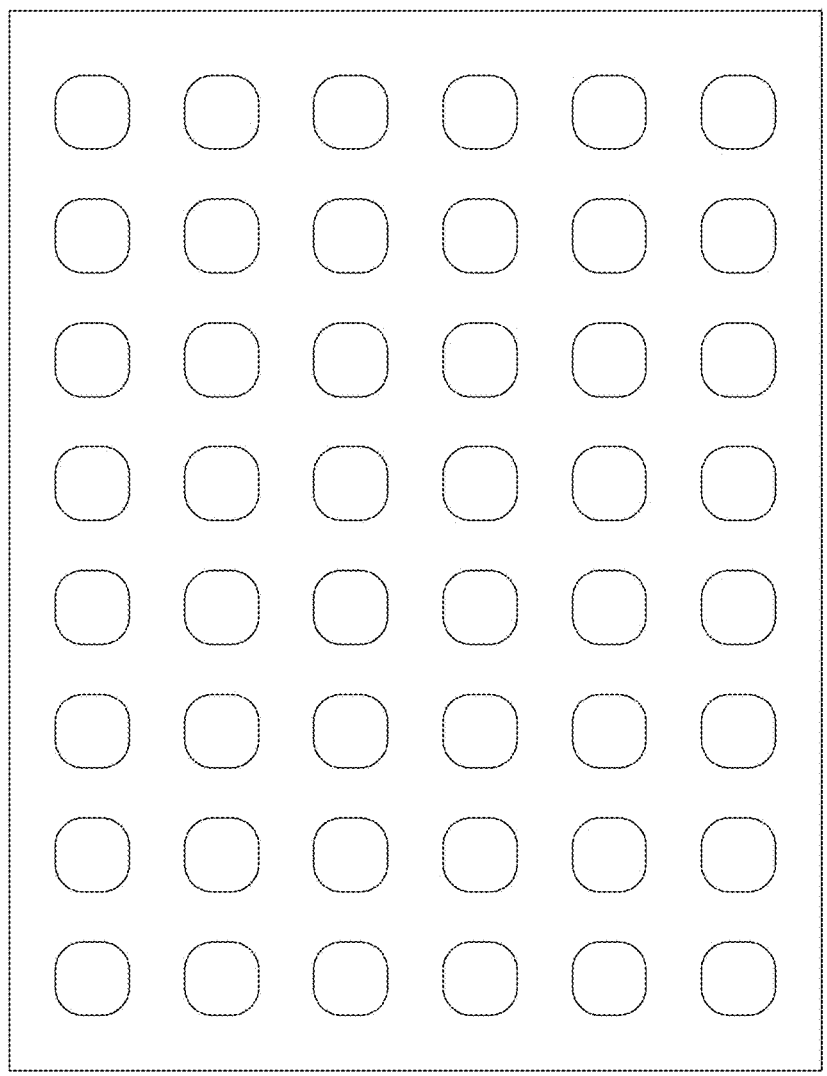
FIG. 13 illustrates another example MEMS grid in accordance with the present disclosure.
Figure 14:
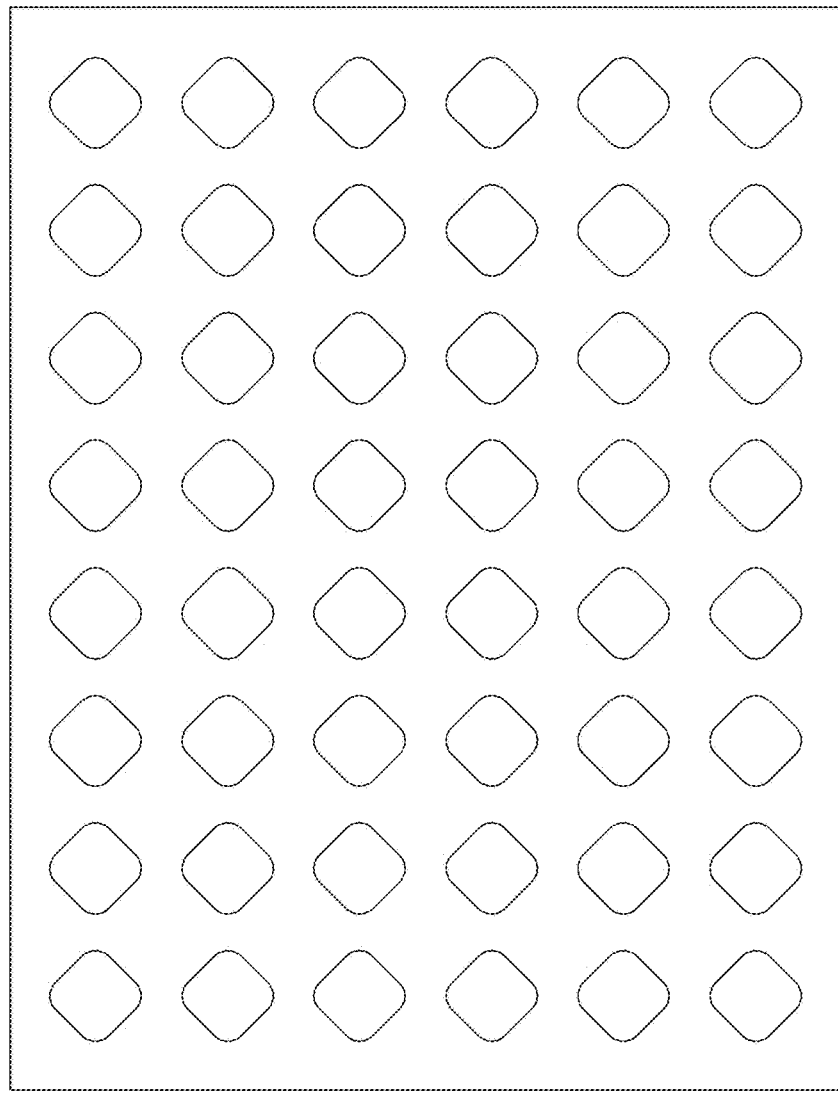
FIG. 14 illustrates another example MEMS grid in accordance with the present disclosure.
Figure 15:
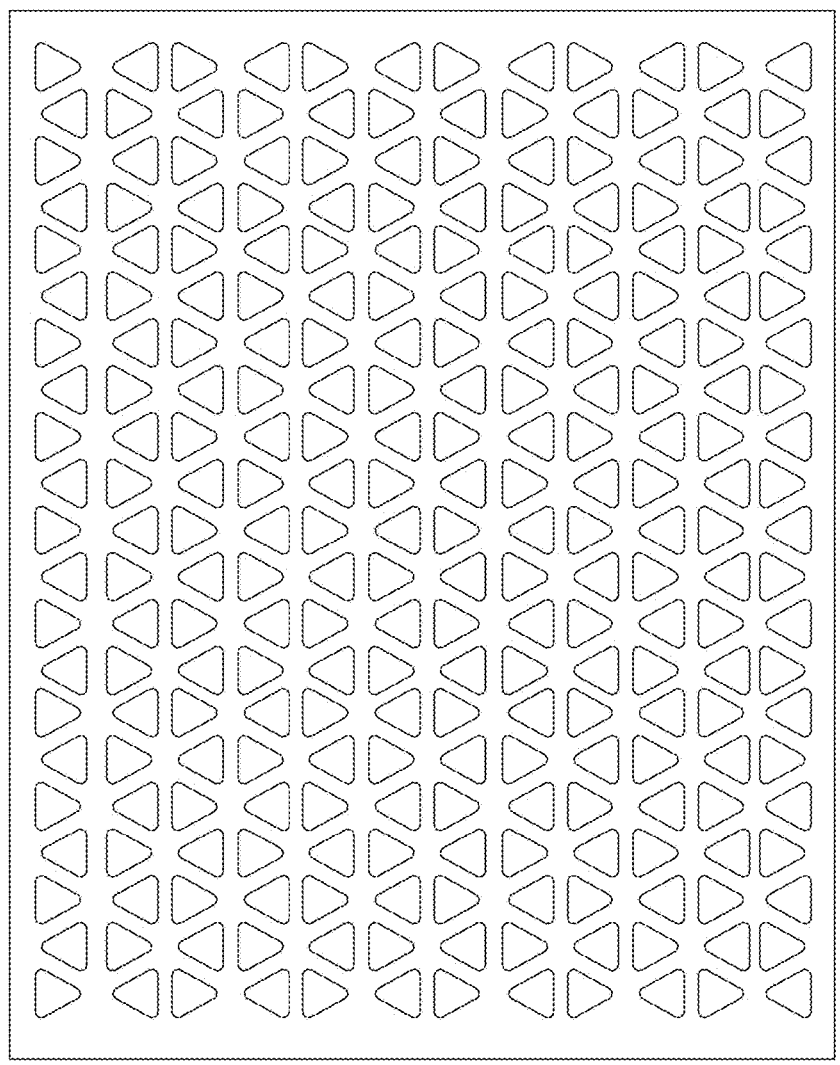
FIG. 15 illustrates another example MEMS grid in accordance with the present disclosure.
Figure 16:
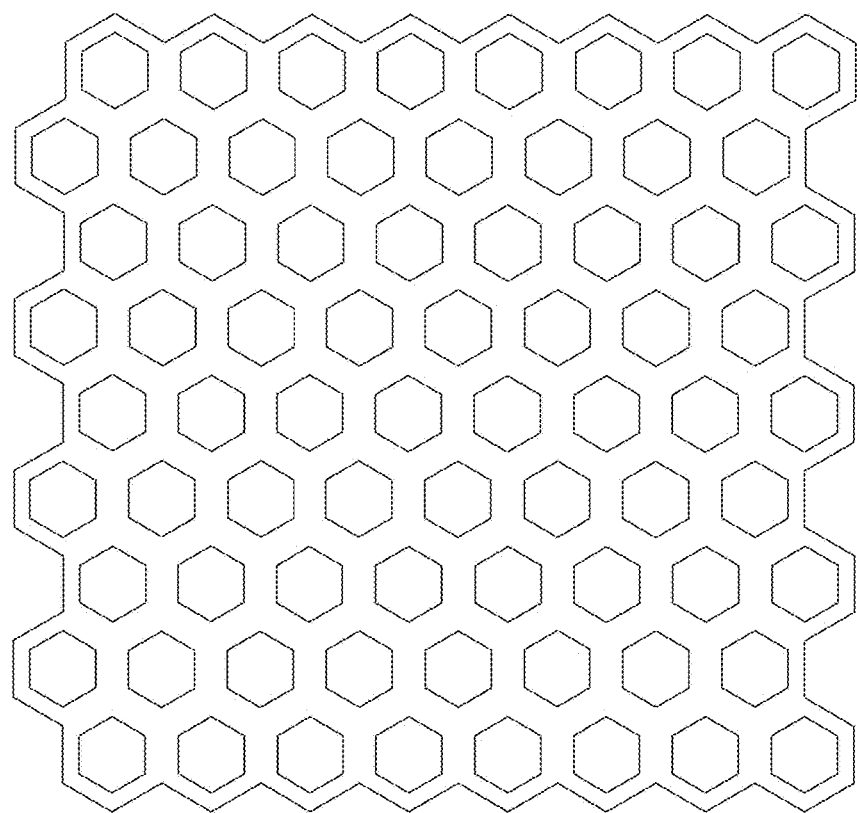
FIG. 16 illustrates another example MEMS grid in accordance with the present disclosure.
Figure 17:
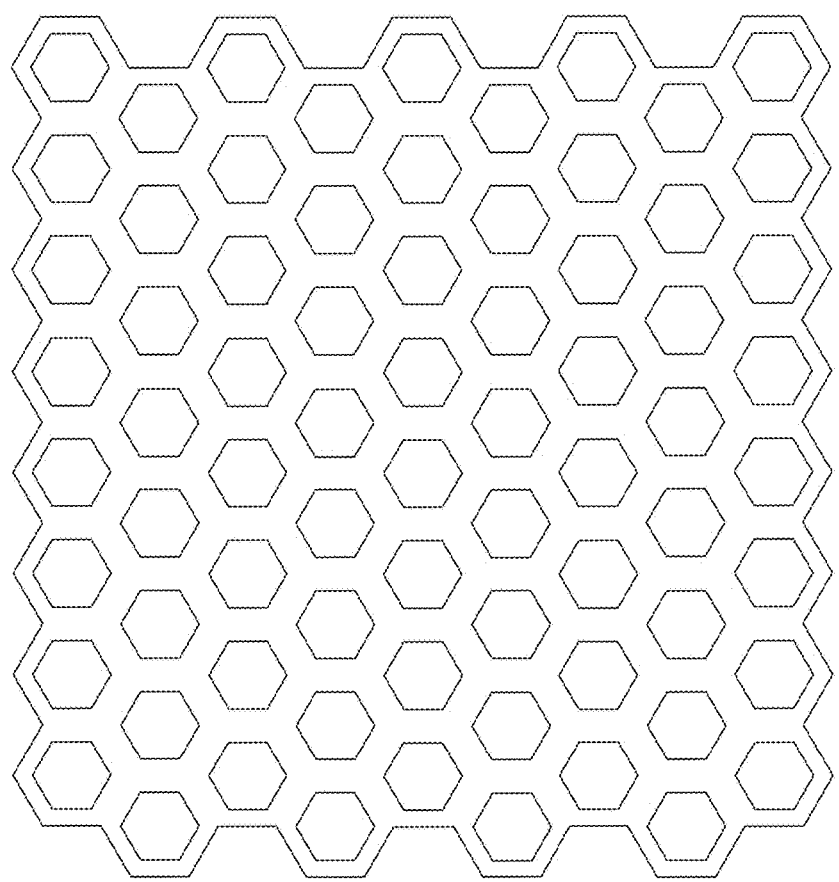
FIG. 17 illustrates another example MEMS grid in accordance with the present disclosure.
Figure 18:
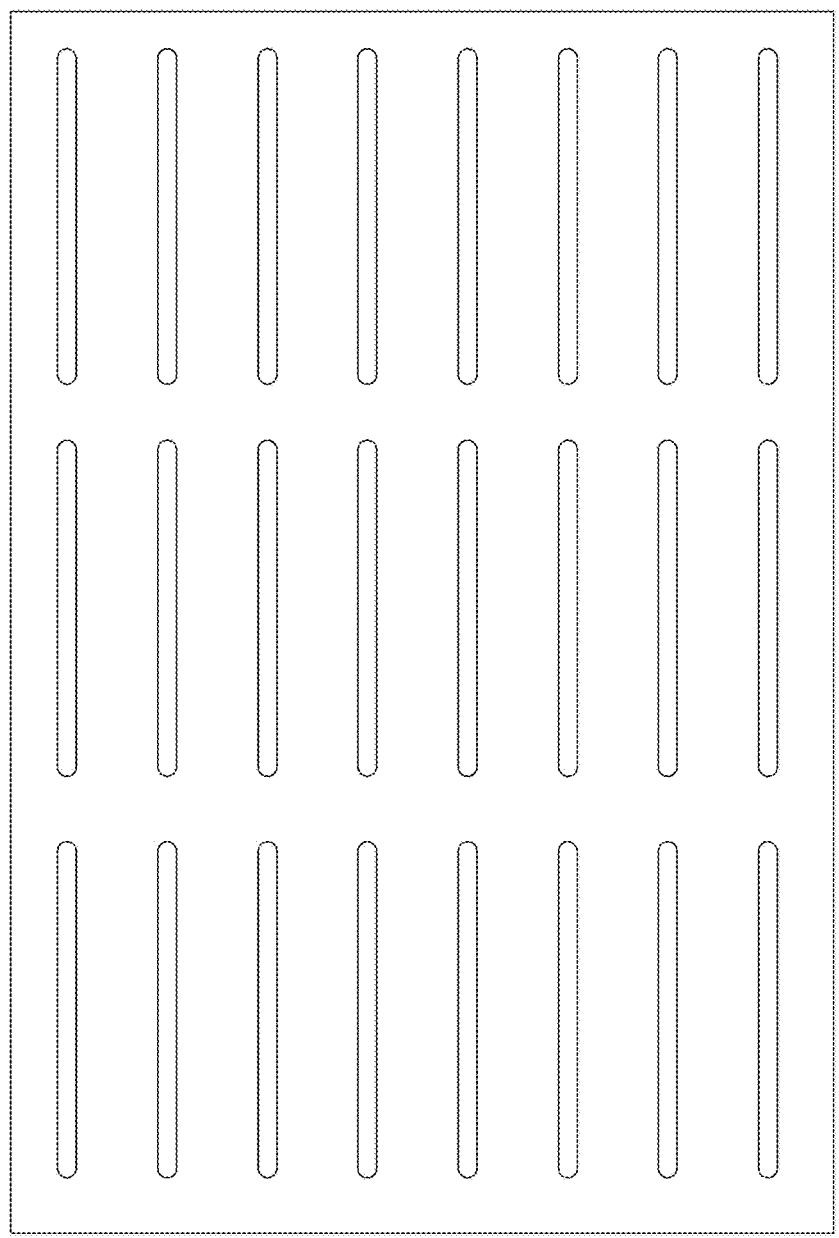
FIG. 18 illustrates another example MEMS grid in accordance with the present disclosure.

The MEMS grid may include many different shapes and configurations. In some embodiments, the MEMS grid may include a plurality of circular holes, as illustrated in FIG. 12. In some embodiments, the MEMS grid may include a plurality of square holes in an orthogrid configuration, as illustrated in FIG. 13. In some embodiments, the MEMS grid may include a plurality of square holes in an orthogrid configuration rotated 45 degrees, as illustrated in FIG. 14. In some embodiments, the MEMS grid may include a plurality of triangular holes, as illustrated in FIG. 15. In some embodiments, the MEMS grid may include a plurality of holes in a honeycomb shape, as illustrated in FIGS. 16 and 17. In some embodiments, the MEMS grid may include a plurality of slots, as illustrated in FIG. 18. In other embodiments, other geometric shapes may be used. Each shape may provide different levels of bending stiffness. For example, a slot shape provides greater stiffness to force perpendicular to the slot's short edge than it does for force perpendicular to the slot's long edge.

Figure 19:
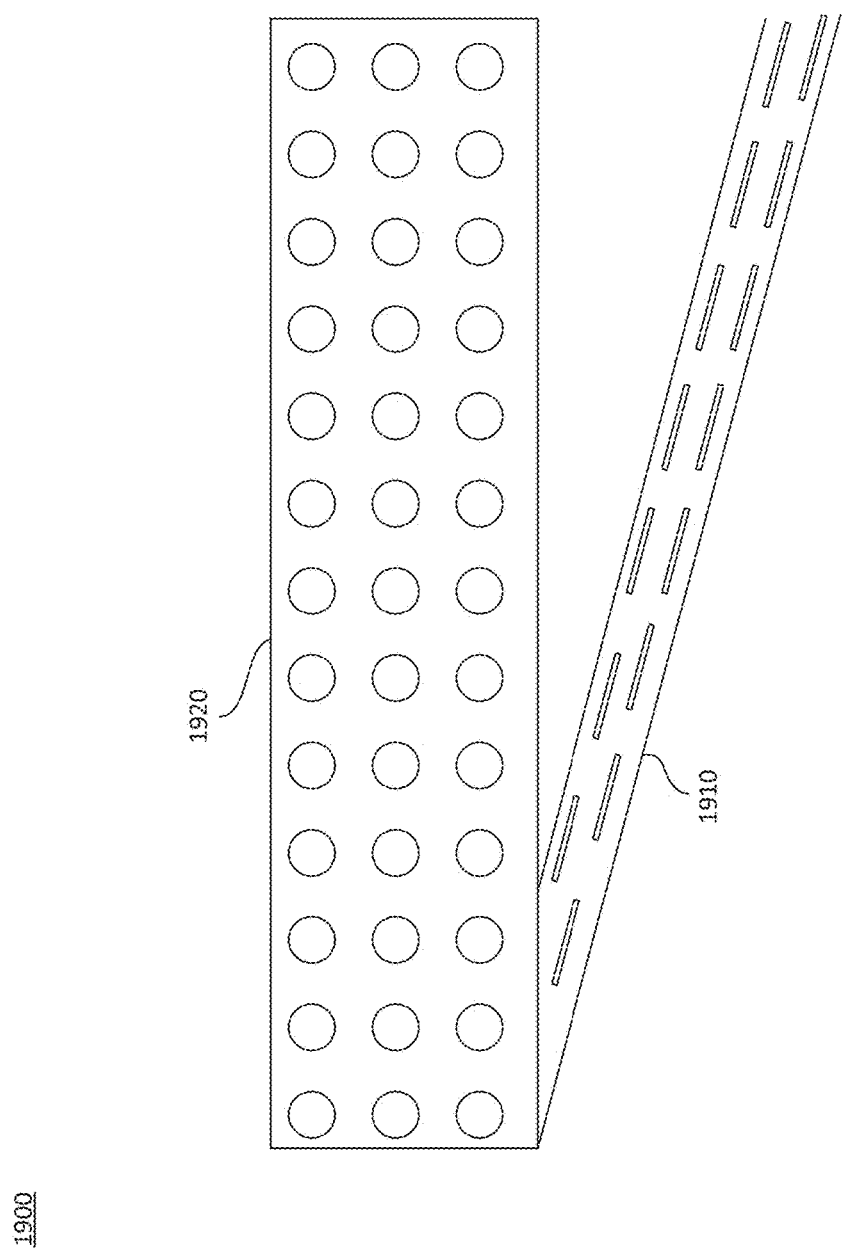
FIG. 19 illustrates an example MEMS grid with a combination of shapes for the holes implemented in a MEMS actuator in accordance with the present disclosure.

In some embodiments, a combination of one or more of these shapes may be used to achieve the desired structural properties of the MEMS device. FIG. 19 illustrates a portion of a MEMS actuator 1900 with a combination of shapes for the holes in accordance with the present disclosure. The layout of the MEMS grid may be designed based on the particular structural properties desired for particular portions of the MEMS device. For example, FIG. 19 illustrates a portion of a MEMS actuator 1900. The MEMS actuator 1900 may include a MEMS grid where a first geometric pattern—i.e., slots—are disposed on the flexure 1910. In some embodiments, slots may be utilized because the flexure may require greater stiffness in one direction as opposed to another. In other embodiments, other patterns may be used that achieve the same level of t. A second geometric pattern—i.e., a square—might be disposed on an inner frame 1920 of the MEMS device. The plurality of holes comprising the MEMS device may be etched in accordance with the first geometric pattern and the second geometric pattern.

In some embodiments, the structural characteristics of the MEMS device may be dependent on the orientation of the holes of the MEMS grid. For example, if a honeycomb shape is used for the holes of the MEMS grid, the honeycomb could be oriented in either an L-direction orientation, as depicted in FIG. 16, or a W-direction orientation, as depicted in FIG. 17. The difference in orientation results in a structure that is softer in the W-direction orientation than the L-direction orientation, without increasing the area of the MEMS grid. Another example is illustrated in FIGS. 13 and 14. Both figures show an orthogrid configuration, which is a configuration of square-shaped holes. In FIG. 13, the holes are arranged in a standard orthogrid configuration. The sides of each hole are configured such that any perpendicular force would be spread over the entire length of the side. When rotated 45 degrees as in FIG. 14, the MEMS grid takes on a diamond shape. In this example orientation, any perpendicular force on the MEMS grid would impact only the vertices of the diamond hole. Each orientation would result in different structural and mechanical properties.

Testing of different shapes and orientations of the holes of the MEMS grid illustrate the differences in structural properties depending on the type of MEMS grid selected. The following table contains testing data for the four MEMS grids illustrated in FIGS. 13-16. FIG. 13 a square shaped MEMS grid, with the holes arranged in an orthogrid formation. FIG. 14 illustrates a triangular shaped MEMS grid, with the holes arranged in an isogrid formation. FIG. 15 illustrates a honeycomb MEMS grid in an L-direction orientation. FIG. 16 illustrates a honeycomb MEMS grid in a W-direction orientation.

| Type of Grid | Bending Stiffness Ratio | Area Ratio |
| --- | --- | --- |
| Isogrid | 0.447 | 0.615 |
| Orthogrid | 0.454 | 0.588 |
| Honeycomb (L) | 0.402 | 0.574 |
| Honeycomb (W) | 0.302 | 0.574 |

The stiffness ratio is the ratio of the stiffness measurements of the MEMS grid type over the stiffness measurement of a solid beam. The higher the ratio, the stiffer the grid. As can be seen, each type of grid provides a different level of stiffness.

In some cases, the plurality of holes in the MEMS grid can be further modified to further manipulate the structural properties. In some embodiments, the holes may be filled with a damping material to absorb shock caused by sudden movement of the MEMS device, or caused by the cantilevers and/or comb fingers of the MEMS device's motion itself. In various embodiments, some of the holes may be filled with a damping material. In other embodiments, all the holes may be filled with a damping material. In some embodiments, the damping material may be a viscoelastic material, rubber, foam, polyurethane, or some other damping material.

As discussed above, MEMS devices fabricated in accordance with embodiments of the process and MEMS grid in accordance with the present disclosure results in a lighter MEMS device due to the removal of the underlying substrate material. As there is less material present, mechanically connecting MEMS structures that must be electrically isolated becomes difficult, as there is less material in which isolation techniques, such as the suspended trench isolation technique discussed above, may be utilized. By modifying the design of the MEMS grid, however, one may not only manipulate the structural characteristics of the MEMS device, but also enable mechanically connected but electrically isolated routing layers to be created.

Figure 20:
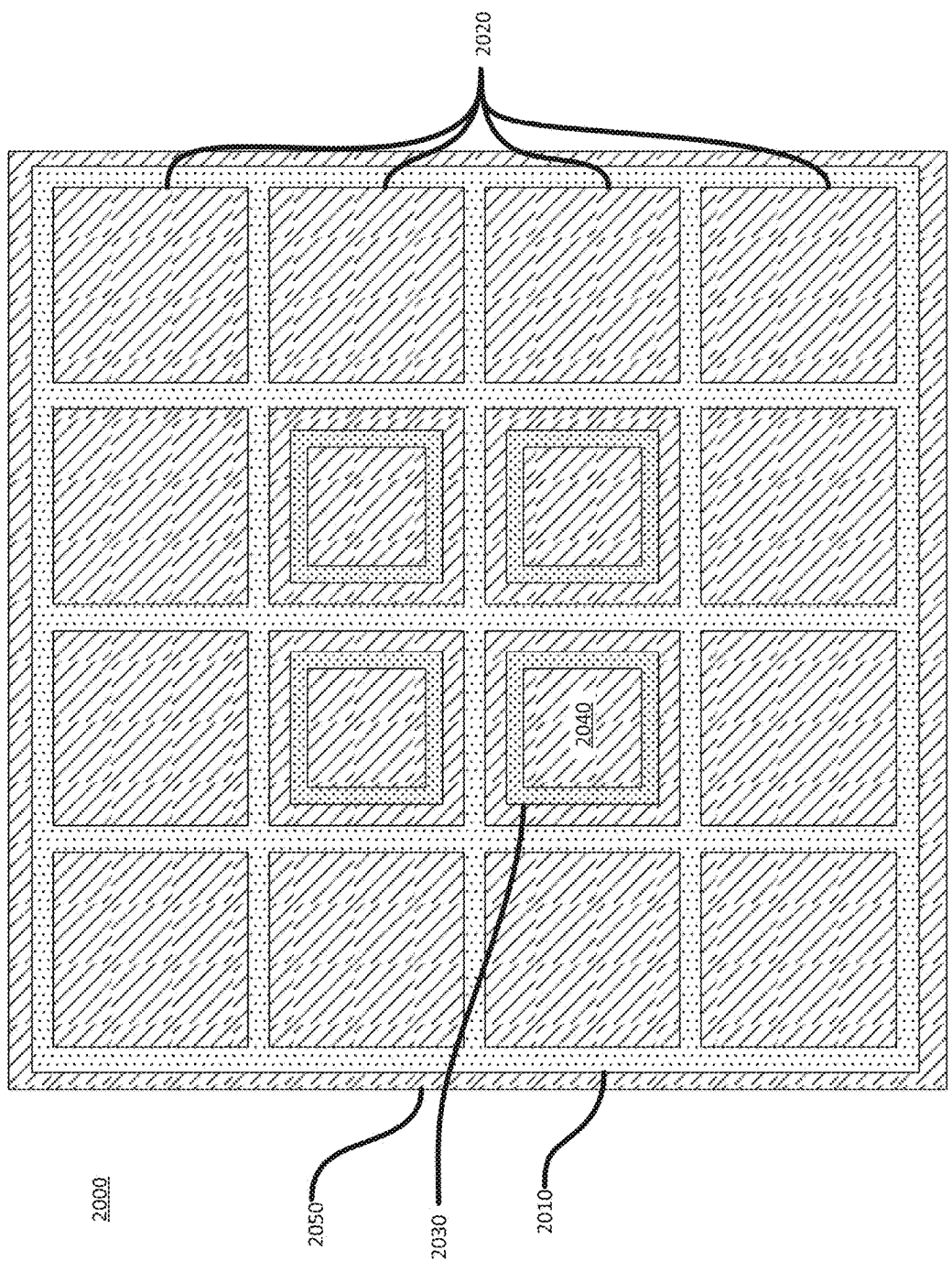
FIG. 20 illustrates an overhead view of an example MEMS grid pattern in accordance with the present disclosure.

FIG. 20 illustrates an overhead view of an example MEMS grid pattern 2000 for mechanically connecting but electrically isolating MEMS structures of a MEMS device in accordance with embodiments of the present disclosure. The example MEMS grid pattern depicted in FIG. 20 shows a trench layout 2010, which comprises a number of squares. Although shown as defining squares, the trench layout 2010 may include other geometric shapes in various embodiments, similar to the different geometric configurations discussed above with respect to the MEMS grid. When overlaid on a substrate wafer 2050, the trench layout 2010 defines a plurality of hole placement areas 2020, which correspond with the plurality of holes created during the separation process discussed above for MEMS devices created in accordance with embodiments of the present disclosure.

In addition to the trench layout 2010, one or more anchor trenches 2030 are included. An anchor trenches 2030 are disposed inside of a hole placement area 2020 defined by the trench layout 2010, and defining an interior hole placement area 2040. In various embodiments, the anchor trenches 2030 may define the same geometric shape as the trench layout 2010, only proportionately smaller. For example, in the illustrated MEMS grid pattern 2000 of FIG. 20, the trench layout 2010 defines a plurality of square-shaped hole placement areas 2020. The anchor trenches 2030 also define interior square-shaped hole placement areas 2040. In other embodiments, the anchor trenches 2030 may define a different geometric shape than the trench layout 2010.

Figure 21:
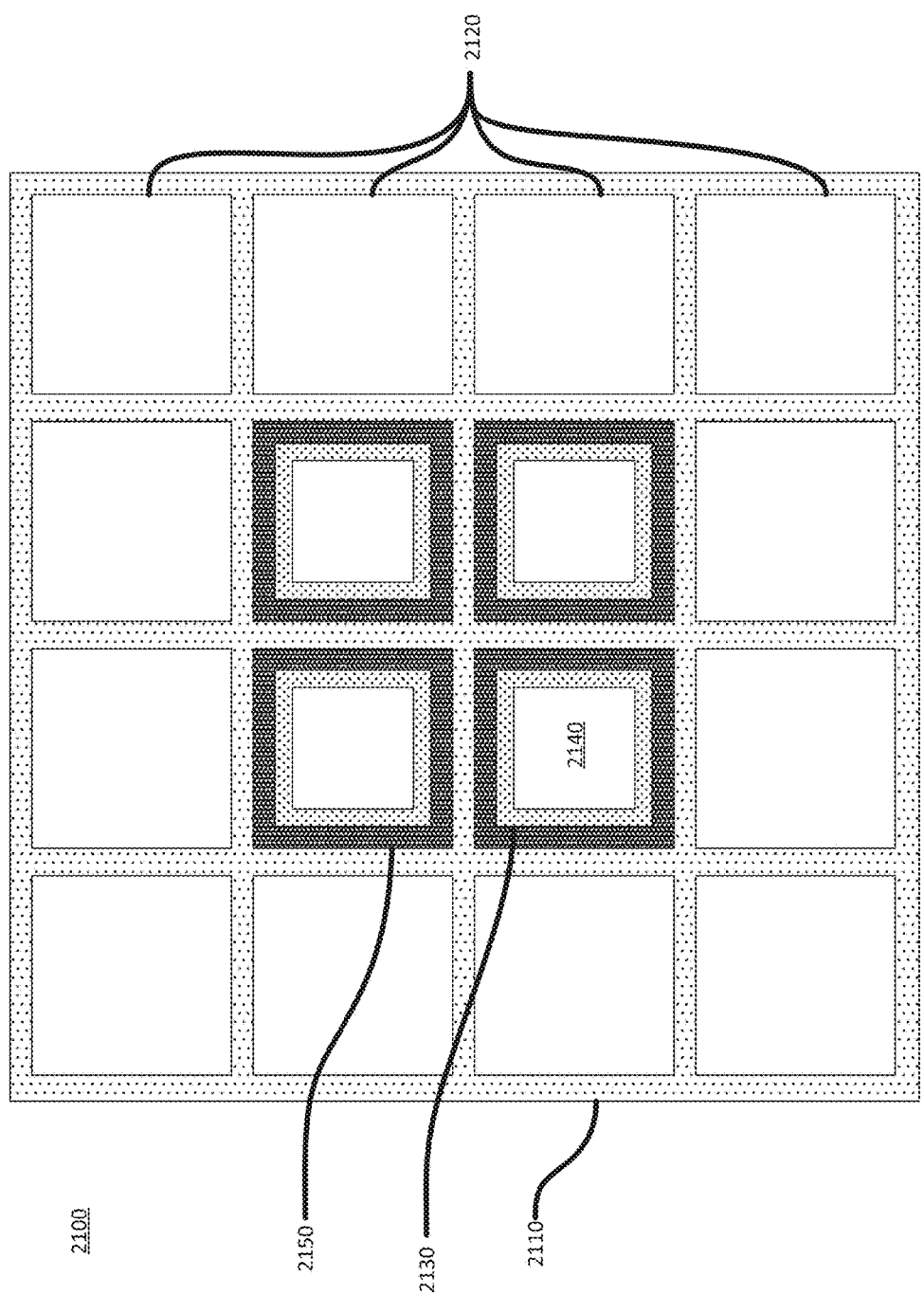
FIG. 21 illustrates another overhead view of an example MEMS grid pattern after separation of the MEMS device from the underlying substrate wafer in accordance with the present disclosure.

Whether the anchor trenches 2030 define the same geometric shape as the trench layout 2010, the portion of the substrate wafer 2050 between the trench layout 2010 and the anchor trench 2030 must be small enough for that portion of the substrate wafer to completely oxidize. In this way, an insulating layer of oxide can be created between the anchor trenches and a plurality of trenches etched into the substrate wafer based on the trench layout, resulting in mechanical connection but electrical isolation between the anchor trenches and the plurality of trenches. A diagram illustrating this example configuration is shown in FIG. 21. The example MEMS grid pattern 2100 illustrated in FIG. 21 shows the MEMS grid pattern 2100 after separation from the underlying substrate wafer. As shown, the portion of the substrate material 2150 between the anchor trench 2130 and the portion of the plurality of trenches defined by the trench layout 2110 is oxidized and remained following the etching process. In this way, the anchor trenches 2130 may be used to provide a secondary routing layer within the MEMS structure comprising this MEMS grid pattern 2100.

Figure 23:
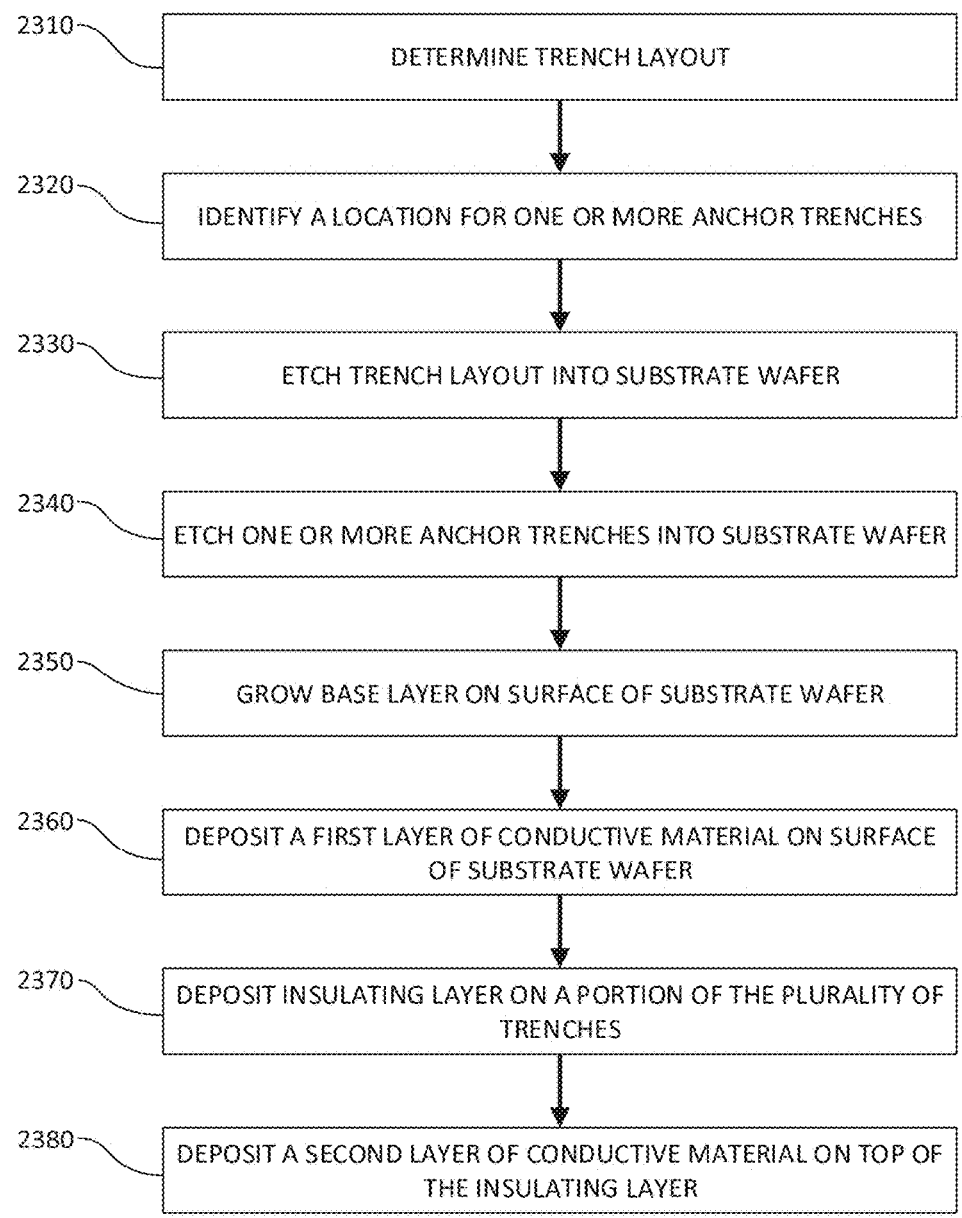
FIG. 23 is a flow diagram of an example method of creating multiple routing layers in MEMS devices in accordance with the present disclosure.

FIG. 23 illustrates an example flow diagram for a method of creating multiple routing layers in a MEMS device in accordance with the technology of the present disclosure. At 2310, a trench layout is determined. The trench layout is similar to the MEMS grid pattern discussed above with respect to the MEMS grid. In various embodiments, the trench layout may be designed to define a plurality of hole placement areas, wherein the hole placement areas comprise one or more geometric shapes. Non-limiting examples of geometric shapes that may be implemented in various embodiments include: honeycombs; squares; circles; triangles; slots; pentagons; or other geometric shapes. Combinations of different geometric shapes may comprise the trench layout in various embodiments.

At 2320, the location for one or more anchor trenches are identified. As discussed above, the anchor trenches are located such that the substrate material between the anchor trench and the plurality of trenches created by the trench layout is capable of being completely oxidized, creating an insulation layer between the two types of trenches.

At 2330 and 2340, a plurality of trenches are etched into the substrate wafer, according to the trench layout, and the anchor trenches are etched into the substrate wafer. The etching process may be similar to the trench etching described above with respect to FIGS. 2A, 2B, and 2C. In various embodiments, 2330 and 2340 may be combined into one operation. Other embodiments may have 2340 performed before 2330.

At 2350, a base layer is grown on the surface of the substrate wafer. The base layer may be grown in a manner similar to the base layer described with respect to FIG. 3A. The surface of the substrate wafer may comprise both the exposed surface of the substrate wafer, as well as the interior face and the bottom face of the trenches etched into the substrate wafer.

At 2360, a first layer of conductive material may be deposited on the substrate wafer. The first layer of conductive material may be deposited in a manner similar to the conductive layer deposition described above with respect to FIGS. 3B and 3C. The first layer of conductive material fills in both the anchor trenches and the plurality of trenches in various embodiments.

Figure 22:
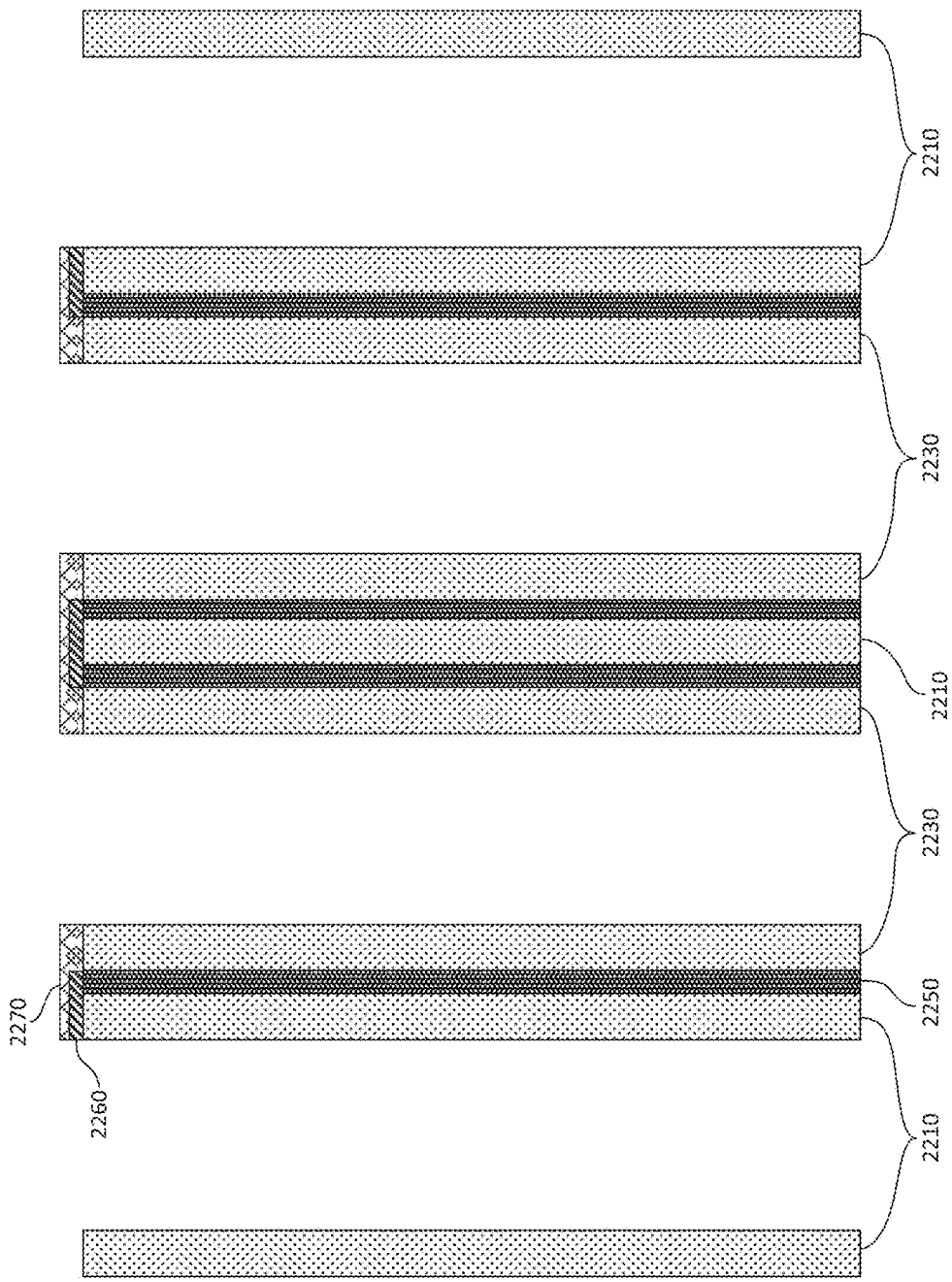
FIG. 22 is a cross-sectional view of an example MEMS device with multiple routing layers in accordance with the present disclosure.

At 2370, an insulating layer is deposited on a portion of the plurality of trenches. The deposition occurs on the portion of the first conductive layer resting on top of the plurality of trenches. In various embodiments, the deposition may occur in a similar manner as that described above with respect to FIGS. 4A, 4B, and 4C. A resist layer may be used to pattern the insulating layer to have the insulating layer cover only the first layer of conductive material and the oxidized portion of the substrate material. An illustration of this is shown in the cross-sectional view of an example MEMS device in accordance with embodiments of the present disclosure in FIG. 22. As illustrated, the insulating layer 2260 is patterned such that it covers only the portion of the plurality of trenches according to the trench layout 2210 that encompasses the anchor trench 2230, as well as the oxidized substrate material 2250.

At 2380, a second layer of conductive material is deposited. The second layer of conductive material may be deposited in a manner similar to the method described above with respect to FIGS. 5A and 5B. Additional patterning may be performed after the second layer of conductive material is deposited in a manner similar to that described above with respect to FIG. 6A, to add additional layers or more precisely pattern the existing layers in various embodiments. The second layer of conductive material is deposited such that it covers the insulating material deposited at 2370, as well as the anchor trenches.

In this way, multiple electrical routing traces may be created within a MEMS structure despite the minimal amount of substrate material remaining based on the MEMS grid and the manufacturing process in accordance with the present disclosure. The plurality of trenches in accordance with the trench layout may act as a first electrical routing trace, while the anchor trenches and second layer of conductive material act as a second electrical routing trace. As shown in the example cross-sectional view of FIG. 22, the second layer of conducting material 2270 is mechanically connected to the insulating layer 2260 and the anchor trenches 2230, as well as being electrically connected to the anchor trenches 2230. The insulating layer 2260 acts to mechanically connect the second layer of conductive material 2270 with the plurality of trenches of the trench layout 2210, while maintaining electrical isolation. In the example MEMS device, the insulating layer 2210 may also cover the oxidized portion of the substrate wafer 2250. In other embodiments, the insulating layer 2260 may only cover the plurality of trenches of the trench layout 2210.

Although the MEMS grid has been described in relation to MEMS devices fabricated in accordance with the present disclosure, the use of the MEMS grid is not limited only to devices fabricated as described above. The MEMS grid may be applied to MEMS devices fabricated using traditional fabrication processes. In addition, the MEMS grid is applicable to fabrication using SOI wafers or other specialized wafer technologies.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration. Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A method of fabricating a MEMS device with controllable structural characteristics, comprising:
   identifying structural requirements of one or more structures of a MEMS device;
   determining a first geometric pattern;
   determining a second geometric pattern; and
   etching a plurality of holes into the MEMS device, wherein a first subset of the plurality of holes etched into the MEMS device corresponds to the first geometric pattern and a second subset of the plurality of holes etched into the MEMS device corresponds to the second geometric pattern.

2. The method of claim 1, further comprising filling the first subset of the plurality of holes with an absorbent material.

3. The method of claim 1, further comprising filling the second subset of the plurality of holes with an absorbent material.

4. The method of claim 1, wherein the first geometric pattern comprises one or more of: squares; triangles; circles; honeycombs; rectangles; and slots.

5. The method of claim 1, wherein the second geometric pattern comprises one or more of: squares; triangles; circles; honeycombs; rectangles; and slots.

6. The method of claim 1, further comprising:
   determining a third geometric pattern; and
   wherein a third subset of the plurality of holes corresponds to the third geometric pattern.

\* \* \* \* \*